US008551796B2

(12) United States Patent
Yamazaki

(10) Patent No.: US 8,551,796 B2
(45) Date of Patent: Oct. 8, 2013

(54) SEMICONDUCTOR DEVICE AND ITS MANUFACTURING METHOD

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 93 days.

(21) Appl. No.: 13/280,439

(22) Filed: Oct. 25, 2011

(65) Prior Publication Data

US 2012/0107985 A1    May 3, 2012

Related U.S. Application Data

(60) Continuation of application No. 11/941,147, filed on Nov. 16, 2007, which is a division of application No. 10/890,129, filed on Jul. 14, 2004, now Pat. No. 7,319,238, and a division of application No. 10/330,284, filed on Dec. 30, 2002, now Pat. No. 6,765,231, and a division of application No. 09/961,525, filed on Sep. 25, 2001, now Pat. No. 6,509,616.

(30) Foreign Application Priority Data

Sep. 29, 2000    (JP) ................................. 2000-298304

(51) Int. Cl.
*H01L 21/00*    (2006.01)
(52) U.S. Cl.
USPC ............................. 438/34; 438/149; 438/151
(58) Field of Classification Search
USPC ........................................... 438/34, 149, 151
See application file for complete search history.

(56) References Cited

U.S. PATENT DOCUMENTS

| | | | |
|---|---|---|---|
| 4,918,504 | A | 4/1990 | Kato et al. |
| 5,446,562 | A | 8/1995 | Sato |
| 5,517,342 | A | 5/1996 | Kim et al. |
| 5,576,858 | A | 11/1996 | Ukai et al. |
| 5,643,826 | A | 7/1997 | Ohtani et al. |
| 5,644,147 | A | 7/1997 | Yamazaki et al. |
| 5,650,636 | A | 7/1997 | Takemura et al. |
| 5,712,495 | A | 1/1998 | Suzawa |
| 5,757,054 | A | 5/1998 | Miyawaki et al. |
| 5,767,926 | A | 6/1998 | Kim et al. |
| 5,767,930 | A | 6/1998 | Kobayashi et al. |
| 5,777,701 | A | 7/1998 | Zhang |
| 5,807,772 | A | 9/1998 | Takemura |
| 5,815,226 | A | 9/1998 | Yamazaki et al. |
| 5,818,070 | A | 10/1998 | Yamazaki et al. |

(Continued)

FOREIGN PATENT DOCUMENTS

| | | |
|---|---|---|
| EP | 0 997 769 A2 | 5/2000 |
| JP | 62-005661 A | 1/1987 |

(Continued)

*Primary Examiner* — Laura Menz
(74) *Attorney, Agent, or Firm* — Fish & Richardson P.C.

(57) ABSTRACT

A manufacturing method of a semiconductor device includes forming a pixel portion and a driving circuit including a semiconductor layer. A scan line in a pixel portion and a first wiring in a driving circuit are formed by patterning a first conductive layer, and a data line in the pixel portion and a second wiring in the driving circuit are formed by patterning a second conductive layer. The first wiring, a channel formation region of the semiconductor layer, and the second wiring are overlapped with each other.

14 Claims, 21 Drawing Sheets

(56) References Cited

U.S. PATENT DOCUMENTS

| | | |
|---|---|---|
| 5,856,689 A | 1/1999 | Suzawa |
| 5,892,562 A | 4/1999 | Yamazaki et al. |
| 5,917,221 A | 6/1999 | Takemura |
| 5,923,962 A | 7/1999 | Ohtani et al. |
| 5,977,562 A | 11/1999 | Hirakata et al. |
| 5,990,491 A | 11/1999 | Zhang |
| 5,990,999 A | 11/1999 | Yeo |
| 5,995,175 A | 11/1999 | Kim et al. |
| 5,998,841 A | 12/1999 | Suzawa |
| 6,031,290 A | 2/2000 | Miyazaki et al. |
| 6,088,070 A | 7/2000 | Ohtani et al. |
| 6,104,461 A | 8/2000 | Zhang et al. |
| 6,115,094 A | 9/2000 | Fukunaga |
| 6,118,506 A | 9/2000 | Yamazaki et al. |
| 6,124,604 A | 9/2000 | Koyama et al. |
| 6,160,269 A | 12/2000 | Takemura et al. |
| 6,175,395 B1 | 1/2001 | Yamazaki et al. |
| 6,208,395 B1 | 3/2001 | Kanoh et al. |
| 6,219,118 B1 | 4/2001 | Zhang |
| 6,255,131 B1 | 7/2001 | Mori et al. |
| 6,274,887 B1 | 8/2001 | Yamazaki et al. |
| 6,277,679 B1 | 8/2001 | Ohtani |
| 6,278,131 B1 | 8/2001 | Yamazaki et al. |
| 6,281,552 B1 | 8/2001 | Kawasaki et al. |
| 6,297,862 B1 | 10/2001 | Murade |
| 6,303,963 B1 | 10/2001 | Ohtani et al. |
| 6,313,900 B1 | 11/2001 | Kawata |
| 6,323,515 B1 | 11/2001 | Yamazaki et al. |
| 6,327,006 B1 | 12/2001 | Sato et al. |
| 6,340,830 B1 | 1/2002 | Takemura |
| 6,344,885 B1 | 2/2002 | Mori et al. |
| 6,358,759 B1 | 3/2002 | Hirabayashi |
| 6,380,558 B1 | 4/2002 | Yamazaki et al. |
| 6,384,818 B1 | 5/2002 | Yamazaki et al. |
| 6,388,721 B1 | 5/2002 | Murade |
| 6,392,255 B1 | 5/2002 | Shibata et al. |
| 6,403,395 B2 | 6/2002 | Hirabayashi et al. |
| 6,433,767 B1 | 8/2002 | Murade |
| 6,433,841 B1 | 8/2002 | Murade et al. |
| 6,451,635 B2 | 9/2002 | Park et al. |
| 6,461,899 B1 | 10/2002 | Kitakado et al. |
| 6,462,723 B1 | 10/2002 | Yamazaki et al. |
| 6,469,317 B1 | 10/2002 | Yamazaki et al. |
| 6,489,222 B2 | 12/2002 | Yoshimoto |
| 6,509,616 B2 * | 1/2003 | Yamazaki ............... 257/390 |
| 6,524,877 B1 | 2/2003 | Nakazawa et al. |
| 6,528,852 B2 | 3/2003 | Takemura |
| 6,542,205 B2 | 4/2003 | Ohtani et al. |
| 6,567,136 B1 | 5/2003 | Sakuramoto et al. |
| 6,573,955 B2 | 6/2003 | Murade |
| 6,583,472 B1 | 6/2003 | Shibata et al. |
| 6,599,785 B2 | 7/2003 | Hamada et al. |
| 6,603,453 B2 | 8/2003 | Yamazaki et al. |
| 6,610,997 B2 | 8/2003 | Murade |
| 6,624,871 B1 | 9/2003 | Kim |
| 6,636,284 B2 | 10/2003 | Sato |
| 6,680,488 B2 | 1/2004 | Shibata |
| 6,740,938 B2 * | 5/2004 | Tsunoda et al. ............ 257/365 |
| 6,757,041 B2 | 6/2004 | Shih |
| 6,765,231 B2 * | 7/2004 | Yamazaki ................. 257/72 |
| 6,778,233 B2 | 8/2004 | Matsuura et al. |
| 6,809,338 B2 | 10/2004 | Murade |
| 6,815,772 B2 | 11/2004 | Takemura |
| 6,828,584 B2 | 12/2004 | Arao et al. |
| 6,864,508 B2 * | 3/2005 | Yamazaki et al. ......... 257/79 |
| 6,888,164 B2 | 5/2005 | Tanaka |
| 6,897,477 B2 | 5/2005 | Shibata et al. |
| 6,906,344 B2 * | 6/2005 | Yamazaki et al. ......... 257/66 |
| 6,919,235 B1 * | 7/2005 | Yamazaki et al. ......... 438/149 |
| 6,919,886 B2 | 7/2005 | Sato et al. |
| 6,933,533 B2 * | 8/2005 | Yamazaki et al. ......... 257/88 |
| 6,946,689 B2 | 9/2005 | Chen |
| 6,952,023 B2 * | 10/2005 | Yamazaki et al. ......... 257/79 |
| 6,953,951 B2 * | 10/2005 | Yamazaki et al. ......... 257/72 |
| 6,960,787 B2 | 11/2005 | Yamazaki et al. |
| 6,965,363 B2 | 11/2005 | Sato et al. |
| 6,995,048 B2 | 2/2006 | Yoneda et al. |
| 7,005,677 B2 | 2/2006 | Park et al. |
| 7,019,805 B2 | 3/2006 | Kim et al. |
| 7,045,373 B2 | 5/2006 | Shih |
| 7,057,675 B2 | 6/2006 | Ha |
| 7,064,482 B2 | 6/2006 | Park |
| 7,078,277 B2 | 7/2006 | Arao et al. |
| 7,084,848 B2 | 8/2006 | Senda et al. |
| 7,094,684 B2 * | 8/2006 | Yamazaki et al. ............ 438/625 |
| 7,098,086 B2 | 8/2006 | Shibata et al. |
| 7,102,231 B2 | 9/2006 | Yamazaki et al. |
| 7,131,884 B2 | 11/2006 | Park |
| 7,142,201 B2 | 11/2006 | Tanaka |
| 7,154,119 B2 * | 12/2006 | Yamazaki et al. ............ 257/66 |
| 7,180,559 B2 * | 2/2007 | Chang et al. .................. 349/106 |
| 7,247,882 B2 | 7/2007 | Yamazaki et al. |
| 7,265,390 B2 * | 9/2007 | Yamazaki et al. ............ 257/79 |
| 7,317,205 B2 * | 1/2008 | Yamazaki et al. ............ 257/59 |
| 7,319,238 B2 * | 1/2008 | Yamazaki ................. 257/72 |
| 7,400,366 B2 * | 7/2008 | Chang et al. .................. 349/43 |
| 7,485,896 B2 * | 2/2009 | Yamazaki et al. ............ 257/79 |
| 7,535,022 B2 * | 5/2009 | Yamazaki et al. ............ 257/66 |
| 7,567,310 B2 * | 7/2009 | Chang et al. .................. 349/43 |
| 8,138,555 B2 * | 3/2012 | Yamazaki ................. 257/390 |
| 2001/0025959 A1 | 10/2001 | Yamazaki et al. |
| 2001/0030322 A1 | 10/2001 | Yamazaki et al. |
| 2002/0008797 A1 | 1/2002 | Yamazaki et al. |
| 2002/0039813 A1 * | 4/2002 | Yamazaki ................. 438/151 |
| 2002/0044230 A1 | 4/2002 | Yamazaki et al. |
| 2002/0047822 A1 | 4/2002 | Senda et al. |
| 2002/0063844 A1 | 5/2002 | Matsuura et al. |
| 2002/0070382 A1 | 6/2002 | Yamazaki et al. |
| 2002/0110941 A1 | 8/2002 | Yamazaki et al. |
| 2002/0140644 A1 | 10/2002 | Sato et al. |
| 2002/0140646 A1 | 10/2002 | Sato et al. |
| 2002/0149053 A1 * | 10/2002 | Tsunoda et al. ............ 257/347 |
| 2003/0015703 A1 * | 1/2003 | Yamazaki et al. ............ 257/66 |
| 2003/0025166 A1 * | 2/2003 | Yamazaki et al. ............ 257/397 |
| 2003/0058396 A1 | 3/2003 | Shih |
| 2003/0075733 A1 * | 4/2003 | Yamazaki et al. ............ 257/200 |
| 2003/0076282 A1 | 4/2003 | Ikeda et al. |
| 2003/0094614 A1 | 5/2003 | Yamazaki et al. |
| 2003/0132436 A1 * | 7/2003 | Yamazaki ................. 257/59 |
| 2004/0017340 A1 | 1/2004 | Tanaka |
| 2004/0056987 A1 | 3/2004 | Song |
| 2004/0087067 A1 | 5/2004 | Yoneda et al. |
| 2004/0100191 A1 | 5/2004 | Park |
| 2004/0109102 A1 * | 6/2004 | Chang et al. .................. 349/44 |
| 2004/0125253 A1 | 7/2004 | Kim et al. |
| 2004/0135520 A1 | 7/2004 | Park et al. |
| 2004/0145306 A1 | 7/2004 | Park et al. |
| 2004/0189611 A1 | 9/2004 | Matsumoto et al. |
| 2004/0195959 A1 | 10/2004 | Park et al. |
| 2004/0214360 A1 | 10/2004 | Shih |
| 2004/0222429 A1 * | 11/2004 | Yamazaki et al. ............ 257/79 |
| 2004/0256623 A1 * | 12/2004 | Yamazaki ................. 257/72 |
| 2004/0263455 A1 | 12/2004 | Tanaka |
| 2005/0167674 A1 | 8/2005 | Shibata et al. |
| 2005/0179040 A1 | 8/2005 | Tanaka |
| 2005/0247937 A1 * | 11/2005 | Yamazaki et al. ............ 257/59 |
| 2005/0247940 A1 | 11/2005 | Shibata et al. |
| 2005/0248514 A1 | 11/2005 | Sato et al. |
| 2005/0263762 A1 | 12/2005 | Kim |
| 2005/0264175 A1 * | 12/2005 | Yamazaki et al. ............ 313/500 |
| 2006/0043527 A1 | 3/2006 | Kwak |
| 2006/0055643 A1 | 3/2006 | Sato et al. |
| 2006/0118790 A1 | 6/2006 | Park et al. |
| 2006/0145605 A1 | 7/2006 | Park |
| 2007/0109467 A1 * | 5/2007 | Chang et al. .................. 349/106 |
| 2007/0145372 A1 * | 6/2007 | Yamazaki et al. ............ 257/66 |
| 2007/0181890 A1 * | 8/2007 | Yamazaki et al. ............ 257/79 |
| 2008/0043164 A1 * | 2/2008 | Chang et al. .................. 349/43 |
| 2008/0135844 A1 * | 6/2008 | Yamazaki ................. 257/59 |
| 2008/0287029 A1 * | 11/2008 | Chang et al. .................. 445/24 |
| 2012/0107985 A1 * | 5/2012 | Yamazaki ................. 438/34 |

(56) References Cited

U.S. PATENT DOCUMENTS

FOREIGN PATENT DOCUMENTS

| | | |
|---|---|---|
| JP | 03-175430 A | 7/1991 |
| JP | 04-072769 A | 3/1992 |
| JP | 05-053147 A | 3/1993 |
| JP | 05-100250 A | 4/1993 |
| JP | 08-023100 A | 1/1996 |
| JP | 10-189999 A | 7/1998 |
| JP | 10-209452 A | 8/1998 |
| JP | 11-002844 A | 1/1999 |
| JP | 11-084423 A | 3/1999 |
| JP | 11-095256 A | 4/1999 |
| JP | 11-298002 A | 10/1999 |
| JP | 11-352521 A | 12/1999 |
| JP | 2000-010120 A | 1/2000 |
| JP | 2000-131716 A | 5/2000 |
| JP | 2000-180899 A | 6/2000 |
| JP | 2001-330859 A | 11/2001 |
| JP | 2002-122889 A | 4/2002 |
| WO | 98/16868 A1 | 4/1998 |

* cited by examiner

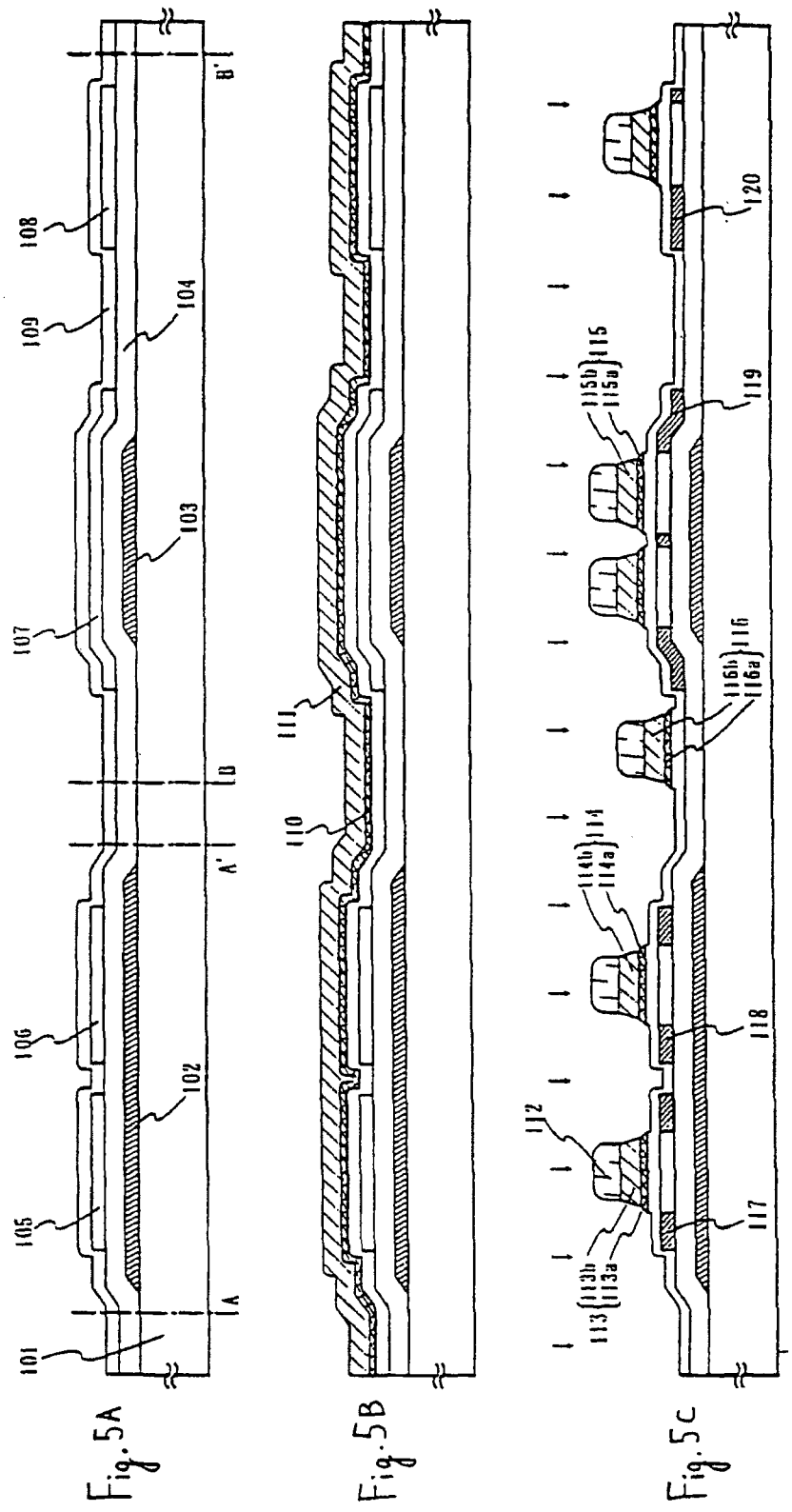

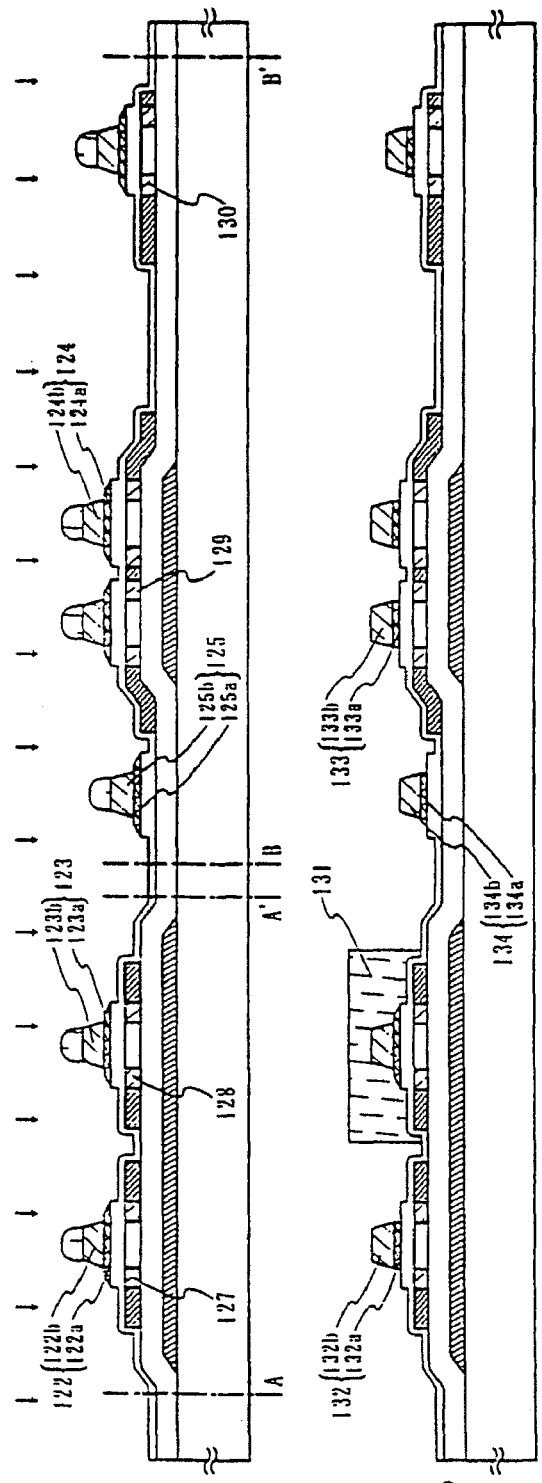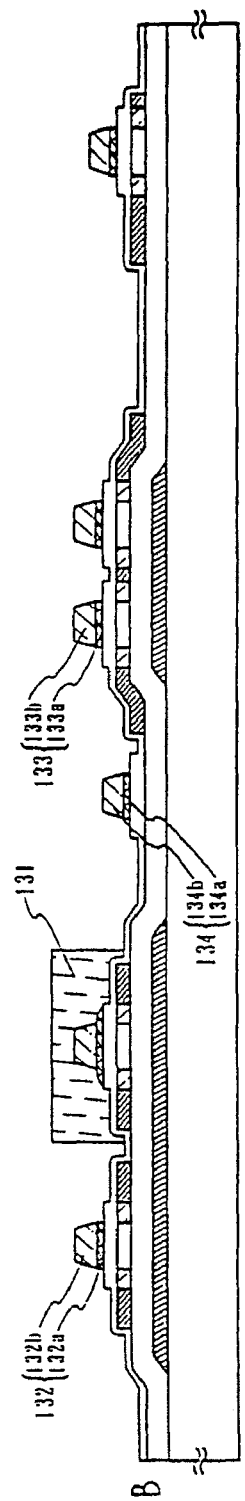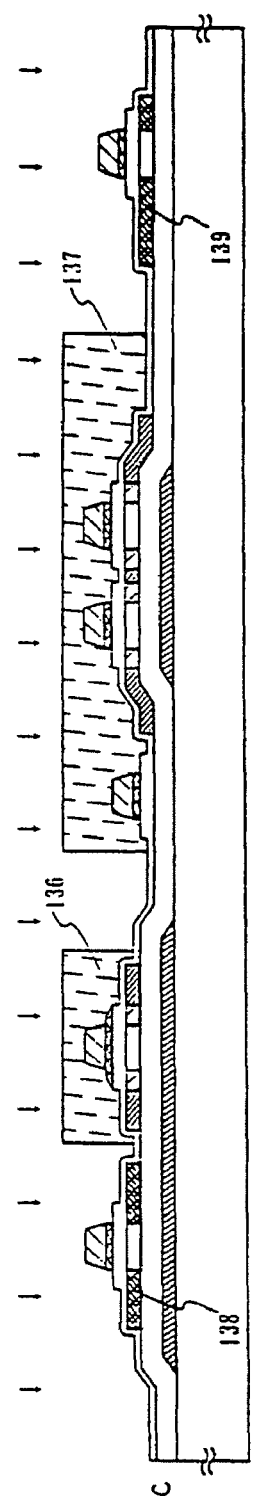

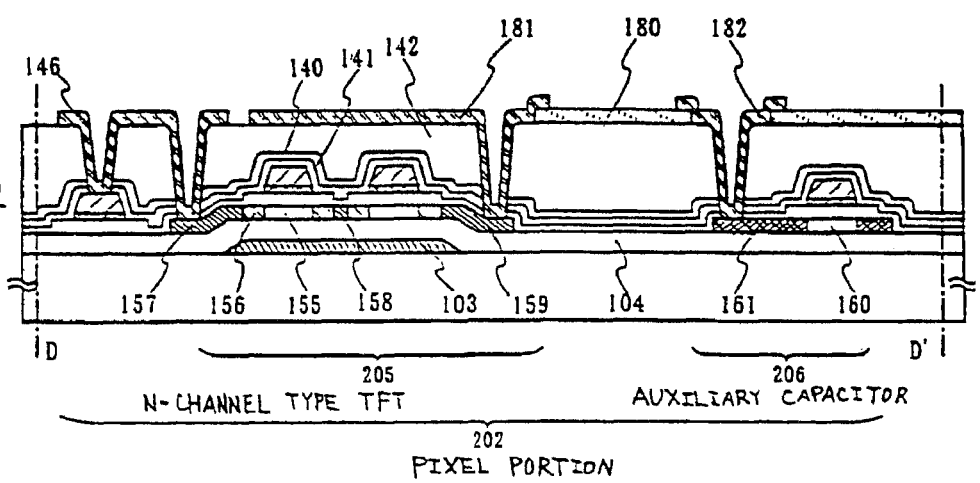

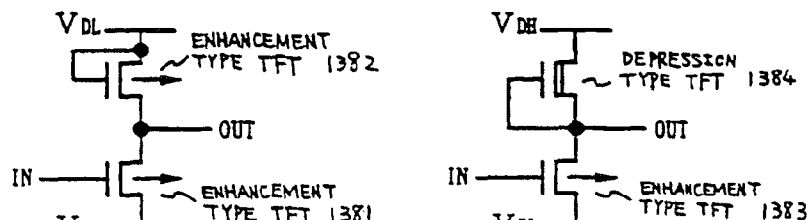
Fig.13A EEMOS CIRCUIT          EDMOS CIRCUIT Fig.13B
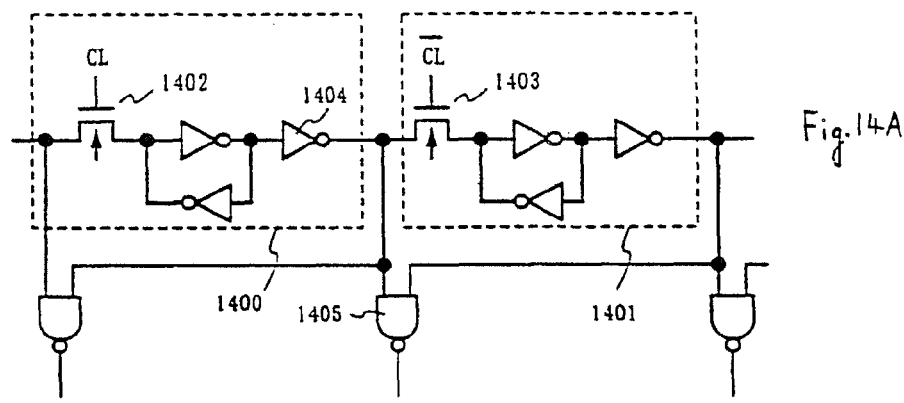
Fig.14A
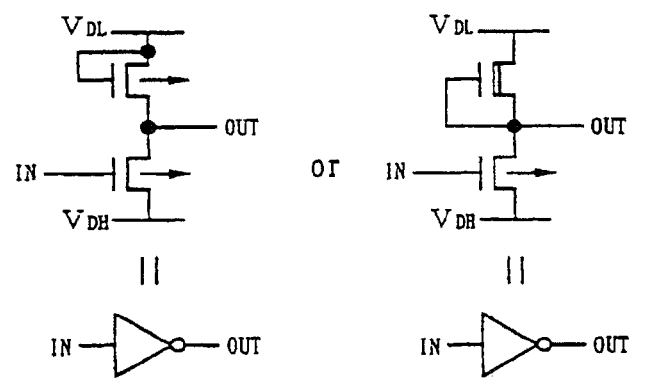
Fig.14B

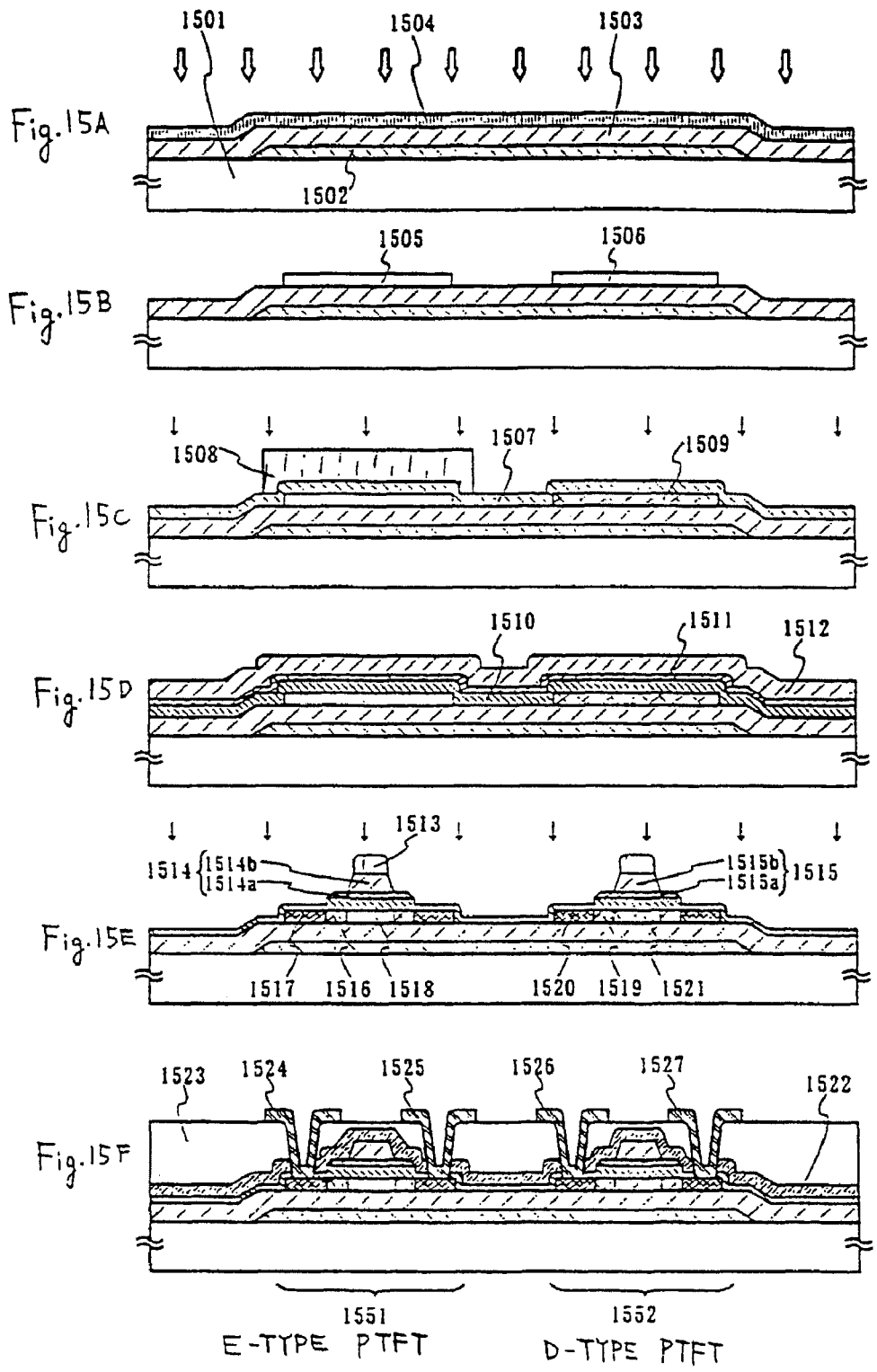

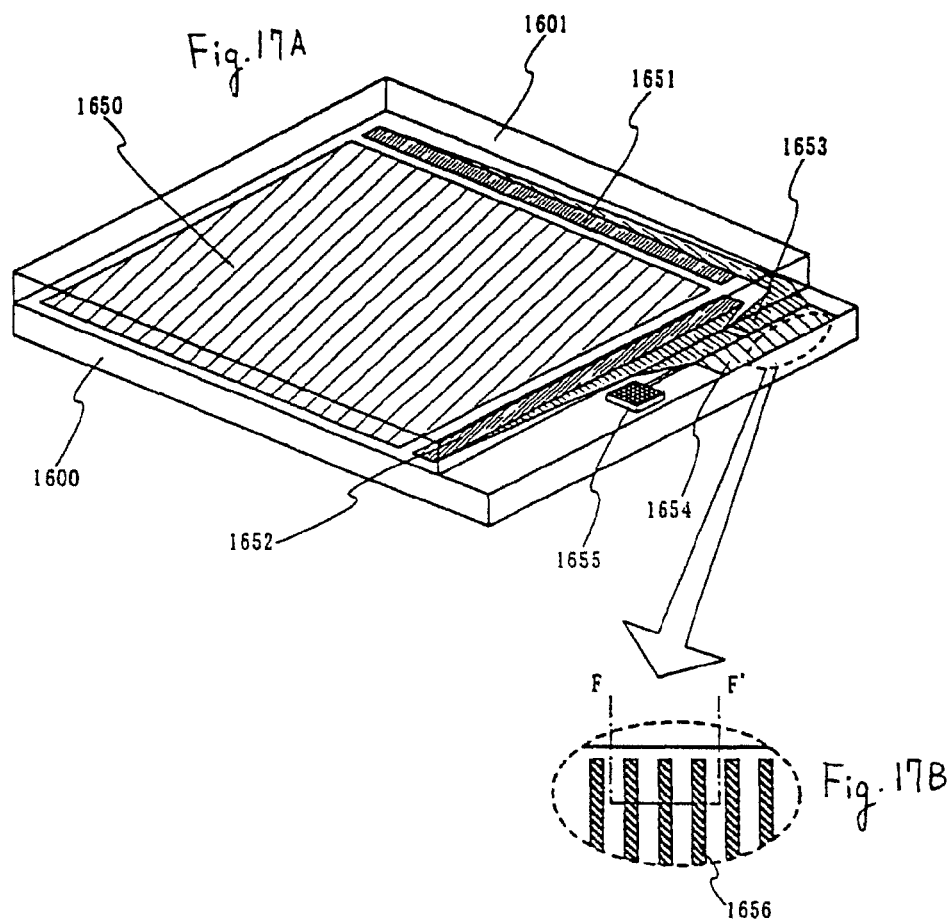
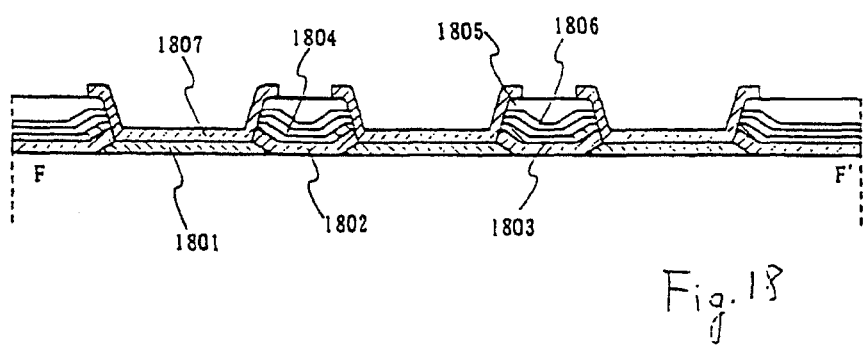

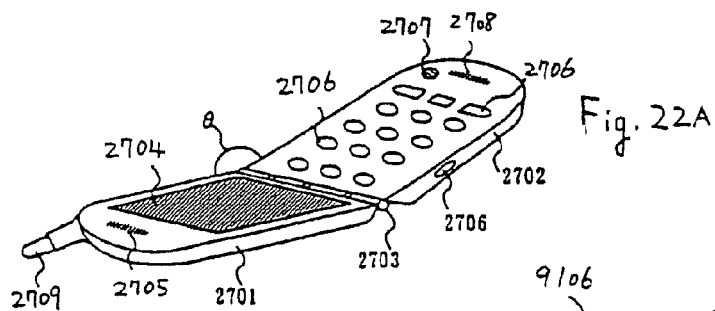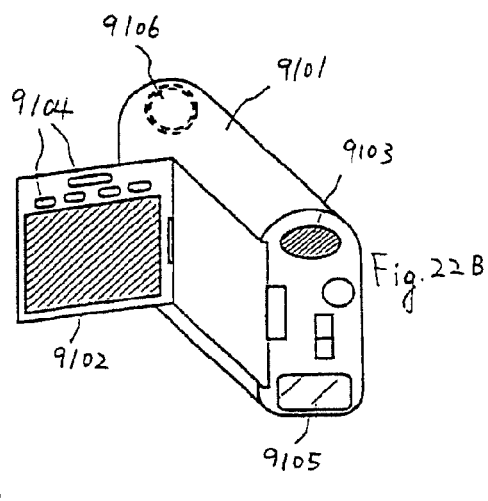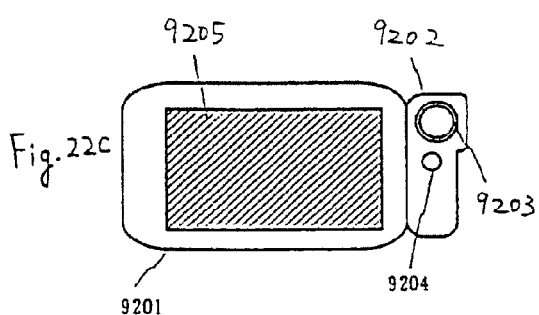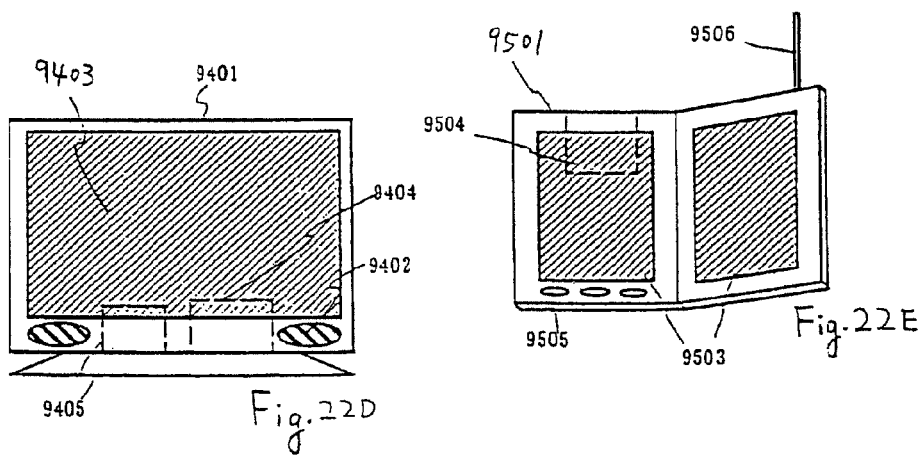

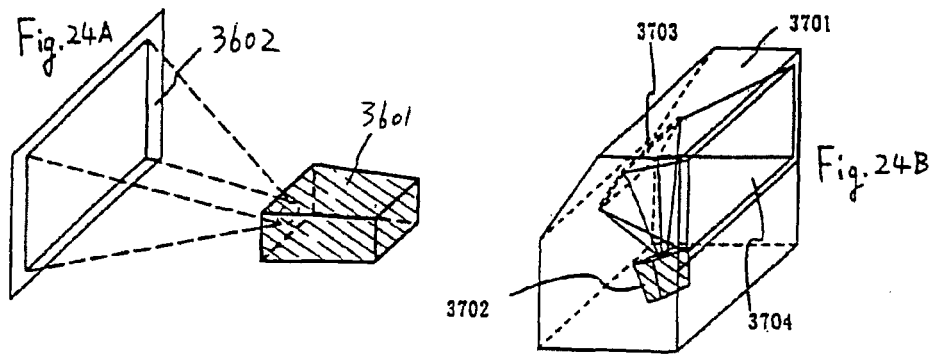
Fig. 24A
Fig. 24B
TO SCREEN
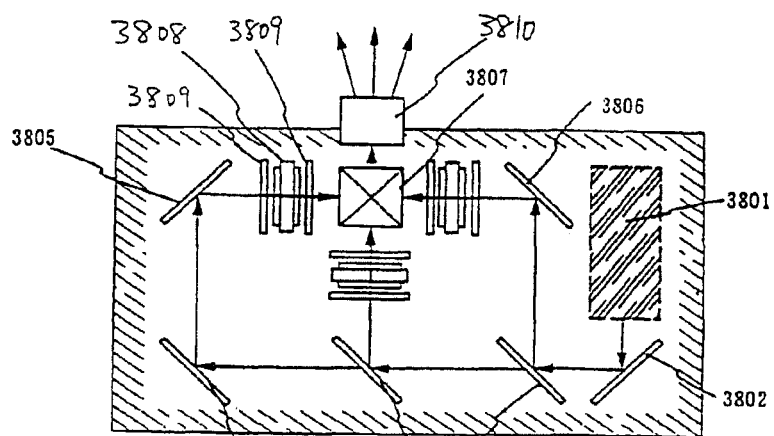
Fig. 24C PROJECTING APPARATUS (THREE PLATE TYPE)
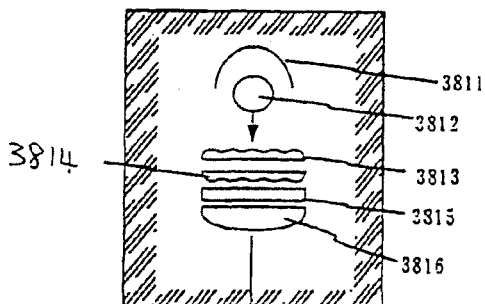
Fig. 24D LIGHT SOURCE OPTICAL SYSTEM

SEMICONDUCTOR DEVICE AND ITS MANUFACTURING METHOD

CROSS-REFERENCE TO RELATED APPLICATIONS

This application is a continuation of U.S. application Ser. No. 11/941,147, filed Nov. 16, 2007, now allowed, which is a divisional of U.S. application Ser. No. 10/890,129, filed Jul. 14, 2004, now U.S. Pat. No. 7,319,238, which is a divisional of U.S. application Ser. No. 10/330,284, filed Dec. 30, 2002, now U.S. Pat. No. 6,765,231, which is a divisional of U.S. application Ser. No. 09/961,525, filed Sep. 25, 2001, now U.S. Pat. No. 6,509,616, which claims the benefit of a foreign priority application filed in Japan as Serial No. 2000-298304 on Sep. 29, 2000, all of which are incorporated by reference.

BACKGROUND OF THE INVENTION

1. Field of the Invention

The present invention relates to a semiconductor device having a pixel portion or having this pixel portion and its driving circuit on the same insulator surface. In particular, the invention can be suitably used in a display unit in which a liquid crystal material is provided between electrodes. In this specification, the semiconductor device generally means a device able to function by utilizing semiconductor characteristics, and the above display device, an integrated circuit and an electronic device mounting the integrated circuit and the display unit thereto belong to a category of the semiconductor device.

2. Description of the Related Art

A matrix driving system (this is called an active matrix driving system) for arranging a thin film transistor (hereinafter abbreviated as TFT) every pixel or dot has become an indispensable technique as high definition of pixel density is advanced. The active matrix driving system using the TFT can prevent crosstalk generated in a simple matrix driving system.

Another advantage of the active matrix type display unit is that an integrated circuit such as a shift register, a latch circuit or a buffer circuit can be formed by the TFT on the same insulator as a driving circuit for transmitting a signal to a pixel portion. Thus, the number of contacts with an external circuit can be very reduced and reliability of the display unit can be raised.

Two kinds constructed by a direct viewing type for directly viewing a picture image displayed in the pixel portion and a projection type for projecting this picture image onto a screen by using an optical system are developed in the display unit using a liquid crystal material. In both these types, segregation is considered on the basis of a screen size such that the direct viewing type is used until about 30 inches in screen size and the projection type is used at a screen size of about 30 inches or more.

A liquid crystal is generally operated by an alternating current, and a frame inversion driving system or a line inversion driving system is adopted. In any case, the TFT is used to control a voltage applied to the liquid crystal. Since resistance of the liquid crystal is high, the TFT requires characteristics such as a sufficiently large ON-state current (showing a drain electric current flowing at a turning-on state time of the TFT) able to charge a pixel capacitor (the liquid crystal itself) during a scanning period, a sufficiently small OFF-state current (showing the drain electric current flowing at a turning-off time of the TFT) able to hold electric charges during a field period, a sufficiently small parasitic capacity between gate and drain electrodes, etc. Since pixel capacity is small and a holding operation is insufficient, an auxiliary capacitor is arranged in a pixel to compensate the pixel capacity and prevent an influence of the parasitic capacity.

In the pixel of the active matrix driving system arranging the TFT therein, a scanning line (gate line) connected to the gate electrode and a data line connected to the source or drain electrode cross each other in addition to a pixel electrode for applying a voltage to the liquid crystal. Two kinds constructed by an additional capacity type for overlapping the pixel electrode and a scanning line (gate line) at the previous stage and an accumulating capacity type for arranging a dedicated capacity line are known in the auxiliary capacitor. In any case, sizes of the TFT and the auxiliary capacitor allowed per one pixel are necessarily reduced as high definition of image quality is advanced. Accordingly, it is indispensable to the obtaining of high numerical aperture of each pixel in the prescribed pixel size that elements required in these pixel constructions are efficiently laid out.

A light interrupting film is an element particularly required in the liquid crystal display unit of a transmission type. A semiconductor film has an optical electroconductive effect in which a resistance value is changed by light irradiation. Accordingly, the semiconductor film has an influence on an OFF-state current by irradiating light from a light source to this semiconductor film. In particular, in the display unit of a projection type, a problem exists in that one portion of light emitted from the liquid crystal display unit is reflected on the interface of a substrate and an air layer and is also reflected in an optical system, and is returned in a reverse direction and is incident to the TFT.

In the case of the projection type with a metal halide lamp, etc. as a light source, light of one million to twenty million 1× is irradiated to the liquid crystal display unit so that design of the light interrupting film becomes important. In the display unit of the transmission type, incident light 28 from the light source is incident from the side of an opposite substrate 22 as shown in FIG. 20, and passes through a liquid crystal 27 and is transmitted to the side of an element substrate 21 forming a TFT 23 therein. A light interrupting film 26 is formed on the TFT 23 so that no incident light 28 is directly irradiated to the TFT 23. However, a light component reflected on the interface of the element substrate 21 and the air layer and diffused within the substrate is considered as diffused light 29, and its one portion is incident to a semiconductor film 24. Conductivity of the semiconductor film 24 is raised by the optical electroconductive effect and this raised conductivity has a bad influence on the image display such as an increase in the OFF-state current of the TFT, a reduction in contrast and generation of crosstalk, etc. However, when light interrupting property is preferentially treated and an area of the light interrupting film 26 is increased to interrupt such light, the numerical aperture is naturally reduced.

SUMMARY OF THE INVENTION

It is indispensable to the realization of high numeral aperture in the limited pixel size that elements required for the construction of a pixel portion are efficiently arranged. A first object of the present invention is to provide an active matrix type display unit having a pixel structure in which a pixel electrode formed in the pixel portion, a scanning line (gate line) and a data line are suitably arranged, and high numerical aperture is realized without increasing the number of masks and the number of processes.

Further, a problem exists in that manufacturing cost is increased when a manufacturing process of the TFT is complicated in the active matrix type display unit. When the manufacturing process becomes complicated to simultaneously form plural TFTs, yield is reduced. When a fault relative to the manufacturing process is caused in a driving circuit, a linear defect is caused. A second object of the invention is to reduce the manufacturing cost of the active matrix type display unit and provide a cheap display unit. Further, another object of the invention is to provide a cheap electronic device using the display unit of the invention in a display portion.

The construction of the invention is characterized in that a first wiring arranged between a semiconductor film and a substrate through a first insulating layer is overlapped with the semiconductor film and is used as a light interrupting film by this overlapping. Further, a second insulating layer used as a gate insulating film is formed on the semiconductor film, and a gate electrode and a second wiring are formed on this second insulating layer. The first wiring and the second wiring cross each other through the first and second insulating layers. In a pixel portion, the first wiring functions as a scanning line (gate line), and the second wiring functions as a data line. A third insulating layer is formed as an interlayer insulating film on the second wiring. A pixel electrode is formed on this third insulating layer. The pixel electrode can be overlapped with the first wiring and the second wiring so that an area of the pixel electrode can be increased in the display unit of a reflection type.

In another construction of the invention, a first wiring and a third wiring are formed on the substrate, and a first insulating layer, a semiconductor film and a second insulating layer used as a gate insulating film are sequentially laminated on the first wiring and the third wiring. Similar to the first construction, a gate electrode, a second wiring, a third insulating layer and a pixel electrode are formed on the second insulating layer. In the case of the display unit of the reflection type, the pixel electrode can be overlapped with the first wiring, the second wiring and the third wiring so that an area of the pixel electrode can be increased and numerical aperture can be improved.

In the above first and second constructions, the semiconductor film is light-interrupted from its both faces by the first wiring and the pixel electrode in the case of the display unit of the reflection type. Such a construction can be preferably used in a liquid crystal display unit particularly assembled into a projecting apparatus of a projector.

Such a pixel structure of the invention can be preferably used in the liquid crystal display unit. In particular, numerical aperture can be greatly improved in the liquid crystal display unit of the reflection type. Further, this pixel structure can be also applied to an EL display unit (a light emitting device or a light emitting diode or OLED (Organic Light Emission Diode)) of an upper face radiating type. The EL (electroluminescent) devices referred to in this specification include triplet-based light emission devices and/or singlet-based light emission devices, for example.

BRIEF DESCRIPTION OF THE DRAWINGS

FIGS. 5A to 5C are cross-sectional views for explaining the manufacturing process of a pixel structure having a driving circuit portion and the auxiliary capacity portion of an additional capacity type.

FIGS. 6A to 6C are cross-sectional views for explaining the manufacturing process of the pixel structure having the driving circuit portion and the auxiliary capacity portion of the additional capacity type.

FIG. 12 is a cross-sectional view for explaining the pixel structure of the transmitting type display unit.

FIGS. 13A and 13B are views showing the constructions of an EEMOS circuit and an EDMOS circuit.

FIGS. 14A and 14B are views showing the construction of a shift register.

FIGS. 15A to 15F are cross-sectional views for explaining manufacturing processes of an E-type PTFT and a D-type PTFT.

FIG. 17A is a perspective view for explaining the structure of the liquid crystal display unit.

FIG. 17B shows a terminal portion of FIG. 17A.

FIG. 18 is a cross-sectional view for explaining the structure of a terminal portion.

FIGS. 22A to 22E are views showing examples of a semiconductor devices.

FIGS. 24A to 24D are views for explaining the construction a projector.

DESCRIPTION OF THE PREFERRED EMBODIMENTS

Figure 1:
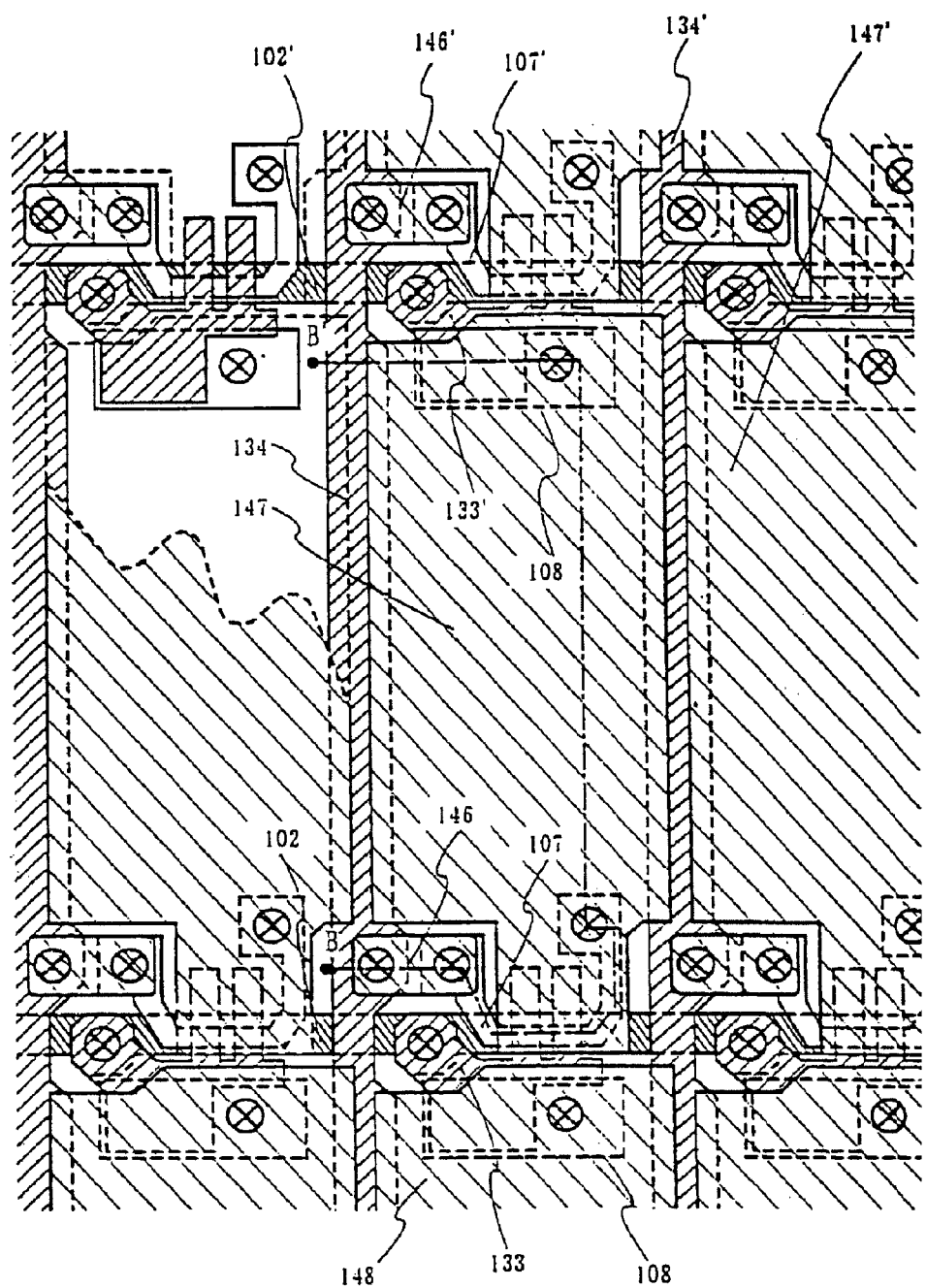
FIG. 1 is a plan view for explaining a pixel structure of the present invention having an auxiliary capacity portion of an additional capacity type.

In the present invention, two kinds of structures can be mainly adopted in accordance with the form of an auxiliary capacity in a pixel. FIG. 1 is a partially detailed view showing the pixel structure of an additional capacity type. In the pixel structure of FIG. 1, a capacitor is formed by overlapping a pixel electrode, a scanning line (gate line) at the previous stage and a gate electrode. In the pixel structure shown in FIG. 1, first wirings 102, 102' each extending from a driving circuit portion and functioning as the scanning line (gate line) are formed in a lowermost layer. An electroconductive material of one or plural kinds as a component selected from molybdenum (Mo), tungsten (W), tantalum (Ta) and titanium (Ti) is selected in a forming material of the scanning line (gate line). The forming material of the scanning line (gate line) has a thickness from 100 to 400 nm, preferably a thickness from 150 to 250 nm.

A first insulating layer (omitted in FIG. 1) is formed on entire faces of the first wirings. Semiconductor films 107, 107' are formed such that these semiconductor films are partially overlapped with the first wirings. The semiconductor film has a crystal structure and a material having silicon as a main component is used in this semiconductor film. Polycrystal silicon manufactured by laser anneal may be also used, and a silicon germanium alloy may be also selected. The semiconductor film may be also replaced with an amorphous silicon film for the purpose of formation of the pixel shown in FIG. 1.

A second insulating layer (omitted in FIG. 1) used as a gate insulating film is formed on an entire face of the semiconductor film. First electrodes 133, 133' as gate electrodes and second wirings 134, 134' functioning as data lines are formed on this insulating film.

The first electrodes 133, 133' and the second wirings 134, 134' are formed by the same material. An electroconductive material of one or plural kinds as a component selected from molybdenum (Mo), tungsten (W), tantalum (Ta) and titanium (Ti) is similarly used in the first electrodes and the second wirings. The first wiring 133 and the first electrode 102 are connected to each other through a contact hole formed in the first insulating layer, and the same electric potential is applied to the first wiring 133 and the first electrode 102 in the same timing. In features of the invention, a channel forming area formed by crossing this first electrode and the semiconductor film is arranged on the first wiring so that the first wiring functions as a light interrupting film.

A third insulating layer (omitted in FIG. 1) is formed on the first electrodes 133, 133' and the second wirings 134, 134', and fourth electrodes 146, 146' and fifth electrodes 147, 147' are formed on the third insulating layer. The fourth electrode 146 is an electrode for connecting the second wiring 134 and a source or drain area formed in the semiconductor film 107. The fifth electrode 147 forms a contact with the other source or drain area formed in the semiconductor film 107. These electrodes are formed by the same material, and a material such as aluminum (Al) and silver (Ag) is used on uppermost surfaces of these electrodes when the display unit of a reflection type is formed. Titanium (Ti), etc. are selected in consideration of heat resisting property and a laminating structure is adopted as a preferable embodiment mode to form the contact with the semiconductor film.

Figures 10A, 10B:
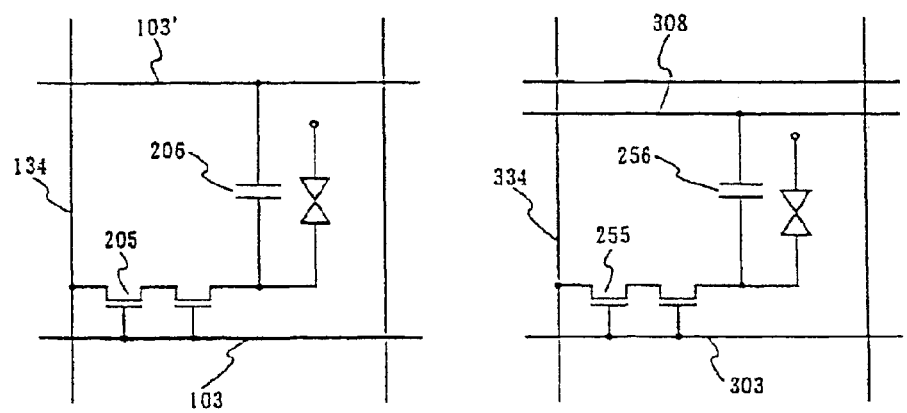
FIGS. 10A to 10B are views showing equivalent circuits.

An additional capacitor is formed by overlapping the semiconductor film 108 and the first electrode 133'. The fifth electrode 147 forms the contact with the semiconductor film 108. An equivalent circuit of this pixel structure is shown in FIG. 10A.

The fifth electrode 147 formed on the third insulating layer can be formed by superposing its end portion on the second wirings 134, 134' or the first wiring 102. The first wiring and the second wiring additionally function as light interrupting films by forming the fifth electrode 147 in this way. Accordingly, the pixel structure of the invention shown in FIG. 1 can increase an occupying area of the fifth electrode (pixel electrode), and can greatly improve numerical aperture.

Further, the first wiring is formed in a lowermost layer, and a channel forming area formed by crossing the semiconductor film and the first electrode is covered with the fifth electrode formed in an upper layer. Thus, an electric field due to a scanning signal applied to the first wiring is shielded and it is possible to prevent a liquid crystal from being influenced and deteriorated by this electric field.

Figure 21A:
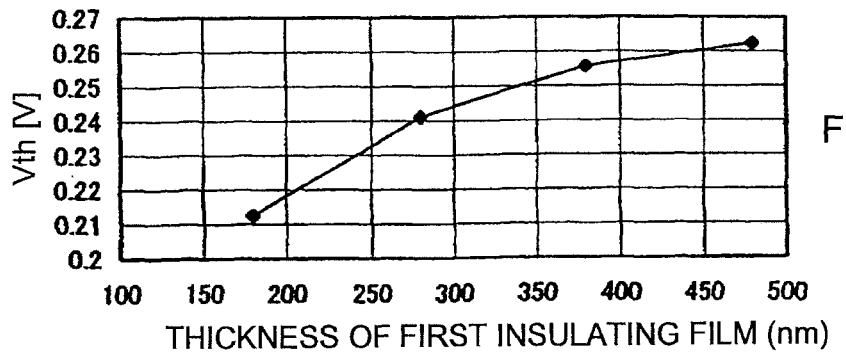
FIGS. 21A to 21C are graphs showing simulation values of Vth, an S-value and an ON-state current with respect to the thickness of a first insulating layer.
Figure 21B:
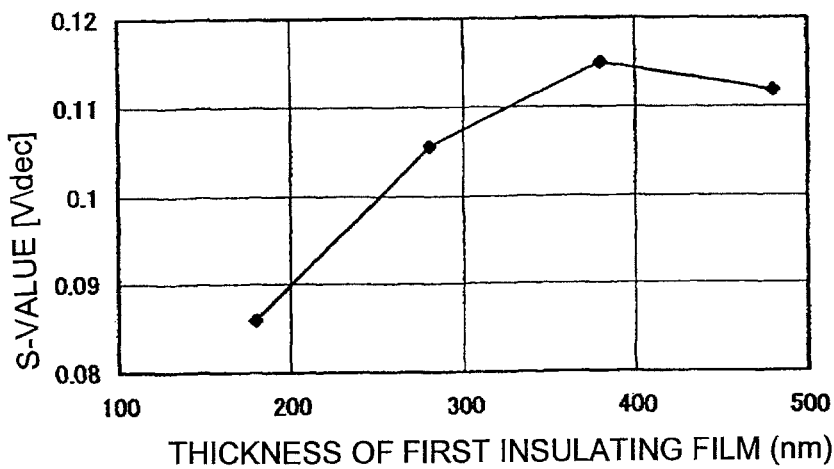
Figure 21C:
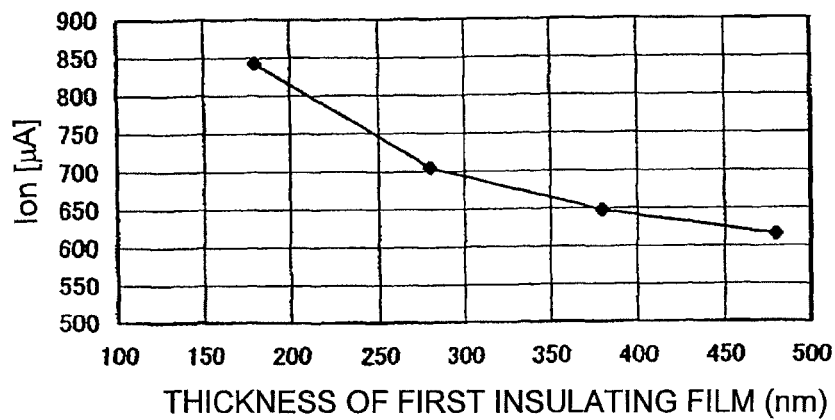

A crossing area of the first electrode and the semiconductor film corresponds to the channel forming area of the TFT formed in this way although this channel forming area depends on the relative relation of thicknesses of the first and second insulating layers. Since the first wiring and the first electrode have an equal electric potential, the thickness of the first insulating layer becomes an important factor for determining characteristics of the TFT. FIGS. 21A to 21C show simulation results of a threshold voltage Vth, a sub-threshold coefficient (S-value) and an ON-state current when the thickness of the first insulating layer is changed. These figures show a tendency in which it is preferable to set the thickness of the first insulating layer to be thinner so as to reduce Vth and the S-value and increase the ON-state current. In FIG. 21, it is supposed that the gate insulating film has 80 nm in thickness and the semiconductor film has 30 nm in thickness and a channel length is set to 2 μm and a channel width is set to 10 μm in the TFT.

The numerical aperture (an area ratio of an area for controlling light transmission or reflection of a pixel portion to an area of all pixels) of the conventional liquid crystal display unit ranges from 40 to 50%. However, the numerical aperture can be increased to about 70 to 80% in the reflection type by adopting the pixel structure of the invention as shown in FIG. 1. Further, it is noticed that such a pixel structure can be realized by six photomasks (in the case of the reflection type). The pixel structure shown in FIG. 1 is formed on the assumption of the liquid crystal display unit of the reflection type. However, in case that a transparent electrode is formed in a predetermined pattern by adding one photomask, the liquid crystal display unit of a transmission type can be also manufactured.

EMBODIMENTS

Embodiment 1

In this embodiment, a forming method of the pixel portion having the structure shown in FIG. 1 will be explained in detail by using the drawings. A process for forming a driving circuit constructed by an n-channel type TFT and a p-channel type TFT will be also explained simultaneously. In this embodiment, the explanations are made by using reference numerals common to FIGS. 1 to 7 for convenience.

Figure 2:
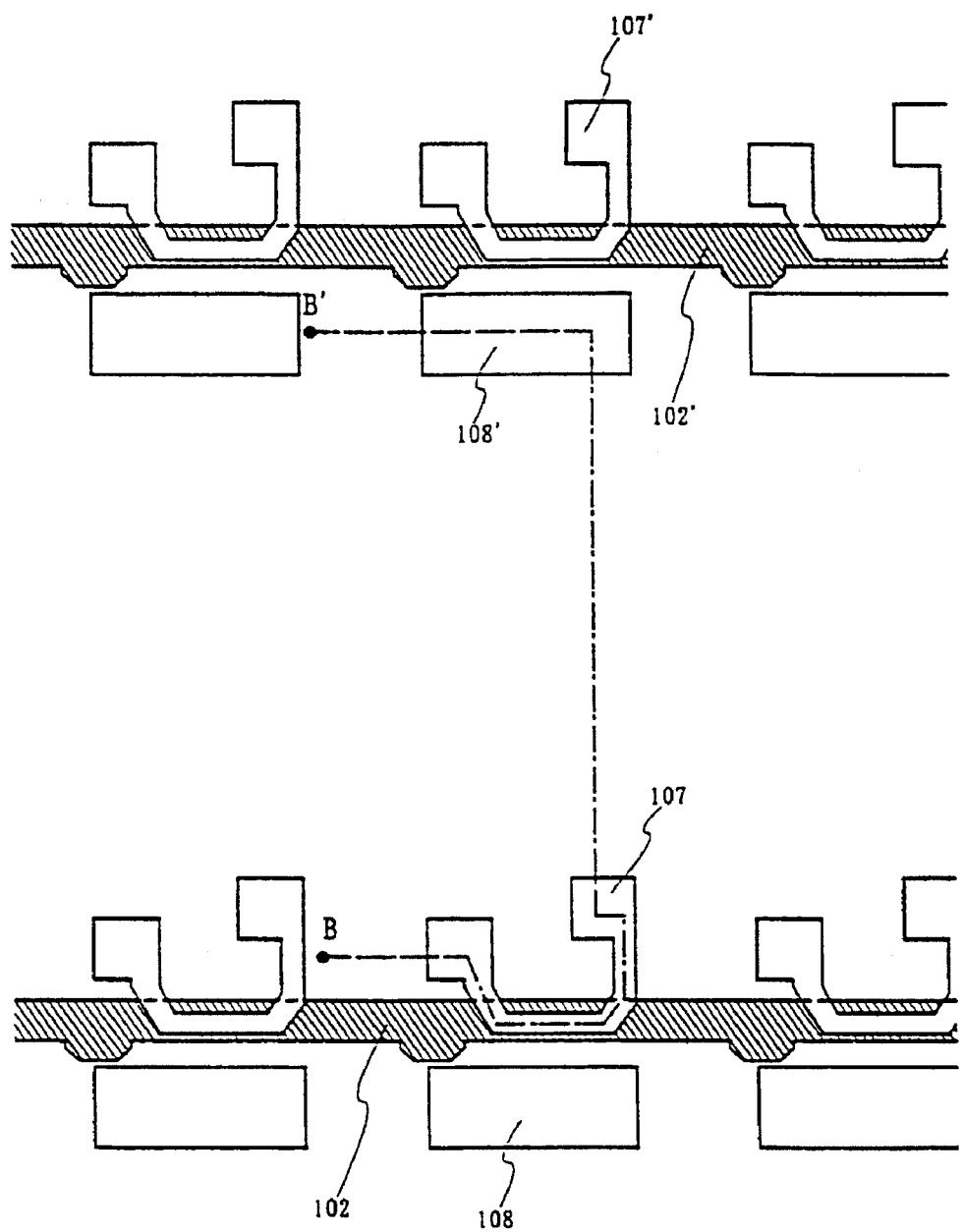
FIG. 2 is a plan view for explaining a manufacturing process of the pixel structure of the invention having the auxiliary capacity portion of the additional capacity type.
Figure 3:
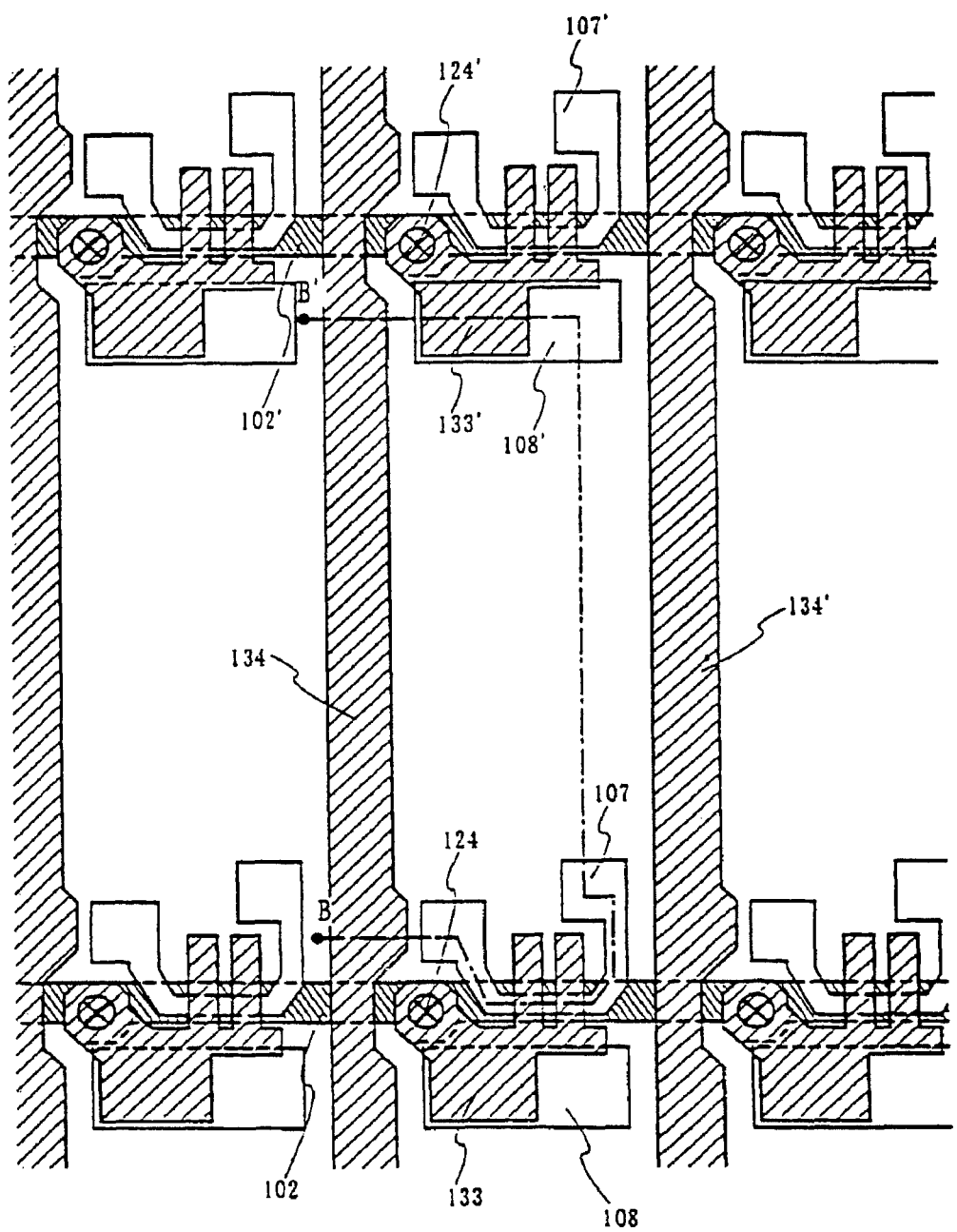
FIG. 3 is a plan view for explaining the manufacturing process of the pixel structure of the invention having the auxiliary capacity portion of the additional capacity type.
Figure 7:
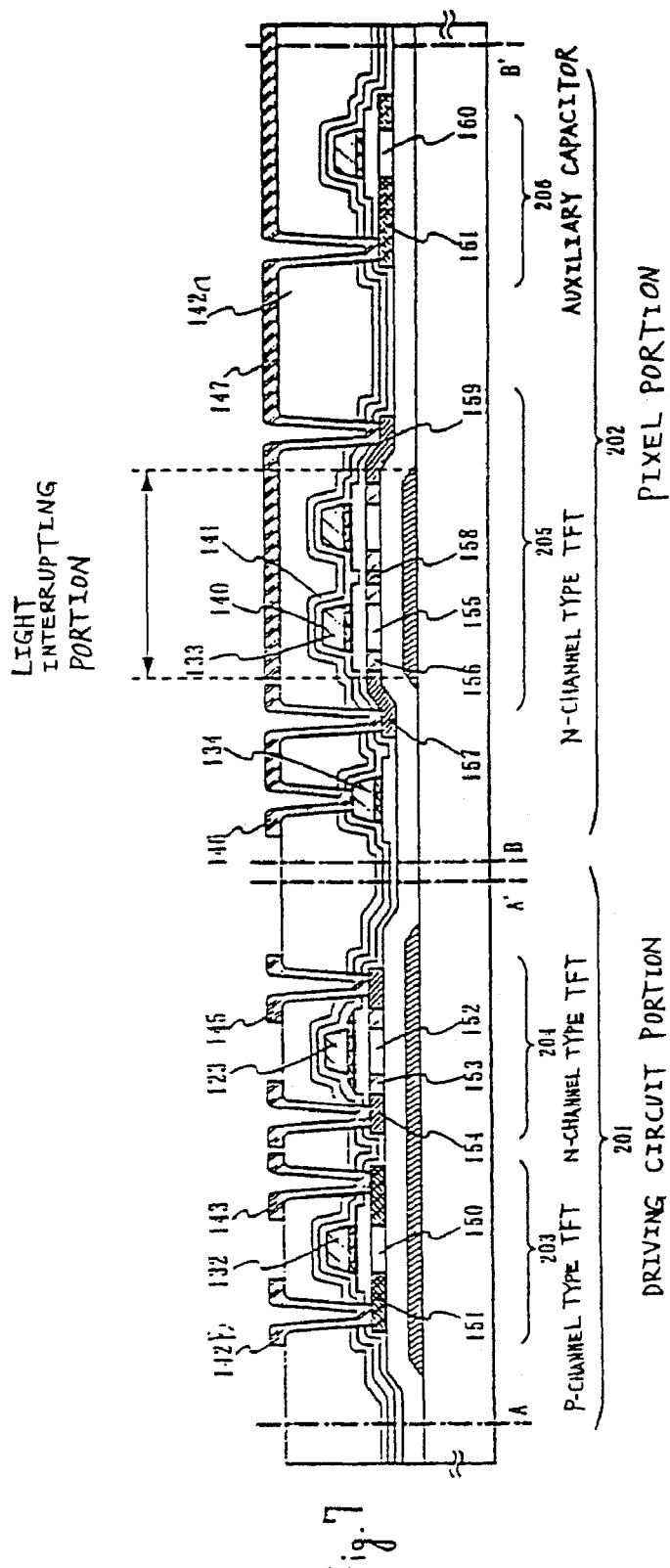
FIG. 7 is a cross-sectional view for explaining the pixel structure having the driving circuit portion and the auxiliary capacity portion of the additional capacity type.

FIGS. 2 and 3 are plan views for explaining a manufacturing process of the pixel structure of the invention. FIG. 4 is a plan view for explaining the manufacturing process of the TFT formed in a driving circuit portion. FIGS. 5 to 7 show longitudinal sectional views corresponding to these plan views.

As shown in FIG. 5A, scanning lines (gate lines) 102, 103 are first formed on a substrate 101. No substrate 101 is particularly limited if this substrate 101 has an insulating surface. The substrate 101 is typically constructed by using a non-alkali glass substrate such as alumino borosilicate glass and barium borosilicate glass. Further, a semi-electroconductive or electroconductive substrate such as a plastic substrate, a silicon substrate forming an insulating film on its surface, and a stainless steel substrate can be also used as the substrate 101. With respect to the scanning line (gate line), a tungsten (W) film having 300 nm in thickness is formed by a sputtering method, and is also formed in a predetermined pattern by a first optical exposure process.

It is desirable to form an end portion of the scanning line (gate line) in a taper shape so as to improve the covering property (step coverage) of a film formed on the scanning line (gate line). The taper portion is formed at an angle from 5 to 30 degrees, preferably an angle from 15 to 25 degrees. The taper portion can be formed by using a reactive ion etching (RIE) technique, and a shape of the taper portion can be controlled by an etching gas and a bias voltage applied to a substrate side. Thus, scanning lines (gate lines) 102, 103 are formed.

The first insulating layer 104 is formed by silicon oxide, silicon nitride or silicon nitride oxide ($SiO_xN_y$) formed by a plasma CVD method or the sputtering method. Otherwise, the first insulating layer 104 is formed by a laminating structure in which these insulating materials are combined. The first insulating layer 104 is typically formed by using the silicon nitride oxide such that the first insulating layer 104 has 250 nm in thickness.

Semiconductor films 105 to 107 formed on this first insulating layer 104 are formed to a thickness of 50 nm. The semiconductor films 105 to 107 are divided into an insular shape via a second optical exposure process. In this embodiment, a p-channel type TFT is formed by using the semiconductor film 105, and an n-channel type. TFT is formed by using the semiconductor films 106, 107. A semiconductor film 108 is arranged to form an auxiliary capacitor.

These semiconductor films are covered with a second insulating layer having 75 nm in thickness, and this second insulating layer is set to a gate insulating film. The second insulating layer is formed by silicon oxide with TEOS (Tetraethyl Ortho Silicate) as a raw material, or silicon nitride oxide, with $SiH_4$ and $N_2O$ as raw materials in the plasma CVD method.

Figure 4A:
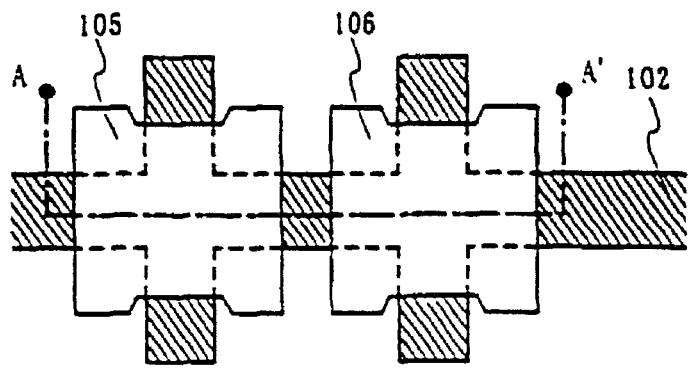
FIGS. 4A to 4C are plan views for explaining the manufacturing process of a CMOS circuit of the invention.

FIG. 2 shows a plan view of the pixel structure in the manufacturing process up to now. Semiconductor films 107, 107' are arranged such that these semiconductor films are partially overlapped with the scanning line (gate line). FIG. 4A similarly shows a plan view of a driving circuit portion. The cross-sectional view of FIG. 5A corresponds to an A-A' line of FIG. 4A and a B-B' line of FIG. 2.

A contact hole is subsequently formed in the first insulating layer by a third optical exposure process, and the scanning line (gate line) is exposed. This contact hole is formed outside the semiconductor films. As shown in FIG. 5B, an electroconductive film is then formed on the second insulating layer. This electroconductive film is arranged to form a gate electrode, and is formed by laminating a tantalum nitride film 110 and a tungsten film 111 respectively set to have 30 nm and 300 nm in thickness.

A resist pattern 112 for forming the gate electrode and the data line is next formed by a fourth optical exposure process as shown in FIG. 5C. First etching processing is performed by using this resist pattern. No etching method is limited, but an ICP (Inductively Coupled Plasma) etching method is suitably used. $CF_4$ and $Cl_2$ are used as a gas for etching of tungsten and tantalum nitride, and RF (13.56 MHz) power of 500 W is applied to an electrode of a coil type at a pressure from 0.5 to 2 Pa, preferably 1 Pa so that plasma is generated. At this time, RF (13.56 MHz) power of 100 W is also applied to a substrate side (sample stage) so that a substantially negative self bias voltage is applied to the substrate side. When $CF_4$ and $Cl_2$ are mixed, tungsten and tantalum nitride can be etched at speeds approximately equal to each other.

In the above etching condition, an end portion can be formed in a taper shape by a mask shape using the resist and effects of the bias voltage applied to the substrate side. The taper portion is set to have an angle from 15 to 45°. An etching time is preferably increased in a ratio of about 10 to 20% to perform the etching without remaining any residue on the gate insulating film. Since a selecting ratio of a silicon nitride oxide film to a W-film ranges from 2 to 4 (typically 3), a face of the second insulating layer exposed by overetching processing is etched about 20 to 40 nm. Thus, first shape electrodes 113 to 115 (tantalum nitrides 113a to 115a and tungstens 113b to 115b) constructed by tantalum nitride and tungsten, and a first shape wiring 116 (tantalum nitride 116a and tungsten 116b) are formed by the first etching processing.

Then, n-type impurities (donor) are doped to the semiconductor films by performing first doping processing. This doping is performed by an ion dope method or an ion implantation method. In a condition of the ion dope method, a dose amount is set to range from $1\times10^{13}$ to $5\times10^{14}$/cm$^2$. An element belonging to a fifteenth group, typically phosphorus (P) or arsenic (As) is used as an impurity element giving the n-type. In this case, gate electrodes 113 to 115 become masks with respect to the doping element, and first impurity areas 117 to 120 are formed by impurity elements passing through the gate insulating film by suitably adjusting an acceleration voltage (e.g., 20 to 60 keV). Phosphorus (P) concentration in the first impurity areas 117 to 120 is set to range from $1\times10^{20}$ to $1\times10^{21}$/cm$^3$.

As shown in FIG. 6A, second etching processing is subsequently performed. In this etching, the ICP etching method is used and $CF_4$, $Cl_2$ and $O_2$ are mixed in an etching gas, and RF power (13.56 MHz) of 500 W is supplied to an electrode of a coil type at a pressure of 1 Pa so that plasma is generated. RF (13.56 MHz) power of 50 W is applied to a substrate side (sample stage) so that a self bias voltage lower than that in the first etching processing is applied to the substrate side. A tungsten film is anisotropically etched by such a condition such that a tantalum nitride film as a first electroconductive layer is left. Thus, second shape electrodes 122 to 124 (tantalum nitrides 122a to 124a and tungstens 122b to 124b) constructed by tantalum nitride and tungsten, and a second shape wiring 125 (tantalum nitride 125a and tungsten 125b) are formed by the first etching processing. The gate insulating film is etched about 10 to 30 nm by this etching processing in a portion uncovered with tantalum nitride so that the gate insulating film becomes thinner.

Figure 4B:
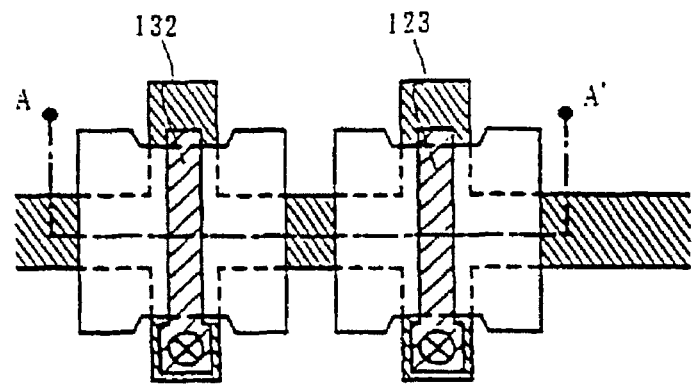

FIG. 3 shows a plan view of the pixel structure at this stage. A second shape electrode 133 is arranged such that the second shape electrode 133 is overlapped with semiconductor films 107 and 108 through a second insulating layer. The second shape electrode 133 is connected to a scanning line (gate line) 102 in a contact portion 124. A data line 134 and the scanning line (gate line) 102 cross each other through first and second insulating layers. FIG. 4B similarly shows a plan view of a driving circuit portion. The cross-sectional view of FIG. 6A corresponds to an A-A' line of FIG. 4B and a B-B' line of FIG. 3.

A dose amount in second doping processing is smaller than that in the first doping processing, and n-type impurities (donor) are doped in the condition of a high acceleration voltage. For example, the acceleration voltage is set to range from 70 to 120 keV, and a dose amount of $1\times10^{13}$/cm$^2$ is set and a second impurity area is formed inside the first impurity area. In this doping, exposed tantalum nitrides 122a to 124a pass and impurities elements are added to the semiconductor films on lower sides of these tantalum nitrides. Thus, second impurity areas 127 to 130 overlapped with the tantalum nitrides 122a to 124a are formed. These impurity areas are changed in accordance with thicknesses of the tantalum nitrides 122a to 124a, but their peak concentrations are changed in a range from $1\times10^{17}$ to $1\times10^{19}$/cm$^3$. A depth distribution of the n-type impurities in these areas is not uniform, but is formed in a certain distribution.

As shown in FIG. 6B, a resist mask 131 covering the second shape electrode 123 is next formed by a fifth optical exposure process, and tantalum nitride films of third shape electrodes 132, 133 are selectively etched. A mixing gas of $Cl_2$ and $SF_6$ is used in an etching gas. Thus, the third shape electrodes 132, 133 conforming end portions of tungsten and tantalum nitride to each other are formed. Further, a data line 134 having a similar shape may be also formed by simultaneously processing the data line.

As shown in FIG. 6C, a mask 136 is then formed by a resist, and p-type impurities (acceptor) are doped to a semiconductor film 105. Boron (B) is typically used in the p-type impurities. The impurity concentration of a third impurity area 138 is set to range from $2 \times 10^{20}$ to $2 \times 10^{21}/cm^3$, and boron having a concentration 1.5 to 3 times the concentration of included phosphorus is added so that a conductivity type is inverted.

The impurity area is formed in each of the semiconductor films in the above processes. The second shape electrode 123 and the third shape electrodes 132, 133 function as gate electrodes. A third shape wiring forms the data line. The gate electrode 133 becomes one electrode forming an additional capacitor, and forms the capacitor in a portion overlapped with the semiconductor film 108. Thereafter, as shown in FIG. 7, a protecting insulating film 140 constructed by a silicon nitride oxide film is formed by the plasma CVD method such that the protecting insulating film 140 has 50 nm in thickness. A process for activating the impurity elements added to each of the insular semiconductor layers is performed for the purpose of control of the conductivity type. The activation is performed by a rapid thermal anneal method (RTA method) and a thermal anneal method using a furnace annealing. In the thermal anneal method, the activation is performed at a temperature from 400 to 700° C., typically, a temperature from 400 to 600° C. within a nitrogen atmosphere in which oxygen concentration is 1 ppm or less, preferably, 0.1 ppm or less. Even when the RTA method is used, the activation processing can be performed by thermal processing for 30 to 120 seconds at 400 to 700° C.

Hydrogenation processing is required to improve characteristics of the TFT, and can be performed by a method for taking a heat treatment and a method for performing plasma processing within a hydrogen atmosphere. In addition, a silicon nitride film 141 having a thickness from 50 to 100 nm is formed and is heated at a temperature from 350 to 500° C. Thus, hydrogen within the silicon nitride film 141 is emitted therefrom and is diffused to the semiconductor film so that hydrogenation can be achieved.

An interlayer insulating film 142 is formed by an organic insulator material such as polyimide and acrylic, and a surface of this interlayer insulating film 142 is flattened. Silicon oxide formed by using TEOS in the plasma CVD method may be also used, but it is desirable to use the above organic material in view of an improvement of the flatness.

A contact hole extending from the surface of the interlayer insulating film 142a to the first impurity area or the third impurity area of each semiconductor film is next formed and wiring is formed by using Al, Ti, Ta, etc. In FIG. 7, reference numerals 142b, 144 designate source lines, and reference numeral 143 designates a drain wiring. Further, reference numerals 147 and 146 respectively designate a pixel electrode and a connecting electrode for connecting the data line 134 and a first impurity area 157 of the semiconductor film 107.

Figure 4C:
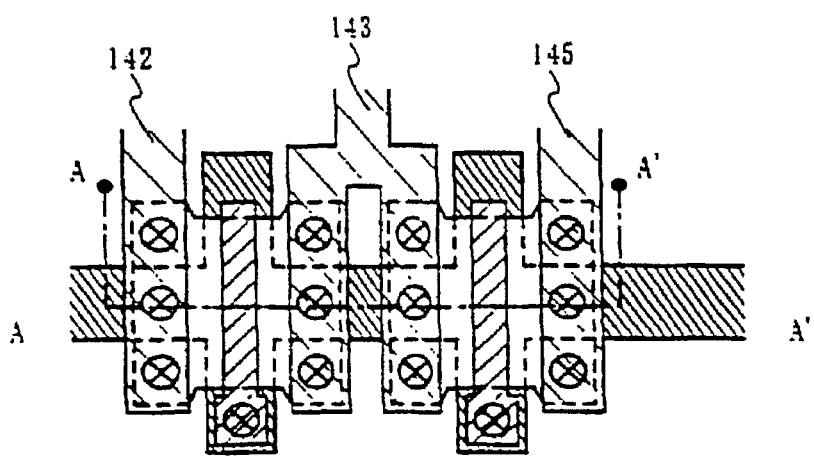

Thus, the pixel structure shown in FIG. 1 and the CMOS circuit shown in FIG. 4C are formed. The cross-sectional view of FIG. 7 corresponds town A-A' line of FIG. 4C and a B-B' line of FIG. 1.

A p-channel type TFT 203 of a driving circuit portion 201 has a channel forming area 150 and a third impurity area 151 functioning as a source area or a drain area. An n-channel type TFT 204 has a channel forming area 152, a second impurity area 153 overlapped with a gate electrode 123, and a fifth impurity area 154 functioning as a source area or a drain area.

A channel forming area 155, a second impurity area 156 located outside a gate electrode 133, and first impurity areas 157 to 159 functioning as a source or drain area are formed in an n-channel type TFT 205 of a pixel portion 202. An auxiliary capacitor 206 is formed by a semiconductor film 108, a second insulating film 109 and a capacity electrode 133. An area 161 adding p-type impurities thereto by the above process is formed in the semiconductor film 108.

The second impurity area formed in the n-channel type TFT is an LDD (Lightly Doped Drain) area. By forming the second impurity area to overlap with the gate electrode as in the n-channel type TFT 204, a high electric field area formed at a drain end is relaxed and deterioration due to a hot carrier effect can be restrained. On the other hand, an OFF-state current can be reduced by arranging the LDD area outside the gate electrode as in the n-channel type TFT 205.

The p-channel type TFT 203 is formed by a single drain structure, but an end portion of the gate electrode can be retreated by adjusting a third etching processing time so that an offset area can be formed between the channel forming area and the impurity area. Such a construction can be also used in the n-channel type TFT 205, and is very effective to reduce the OFF-state current.

Thus, an element substrate forming the pixel portion and the driving circuit by the TFT can be formed on the same substrate. In a manufacturing process of the element substrate shown in this embodiment, TFTs having different constructions of the impurity area can be formed on the same substrate by six photomasks. Further, as shown in FIG. 7, light interrupting property can be improved by forming a light interrupting portion by nipping the channel forming area by the pixel electrode 147 and the gate wiring 133.

Embodiment 2

Figure 8:
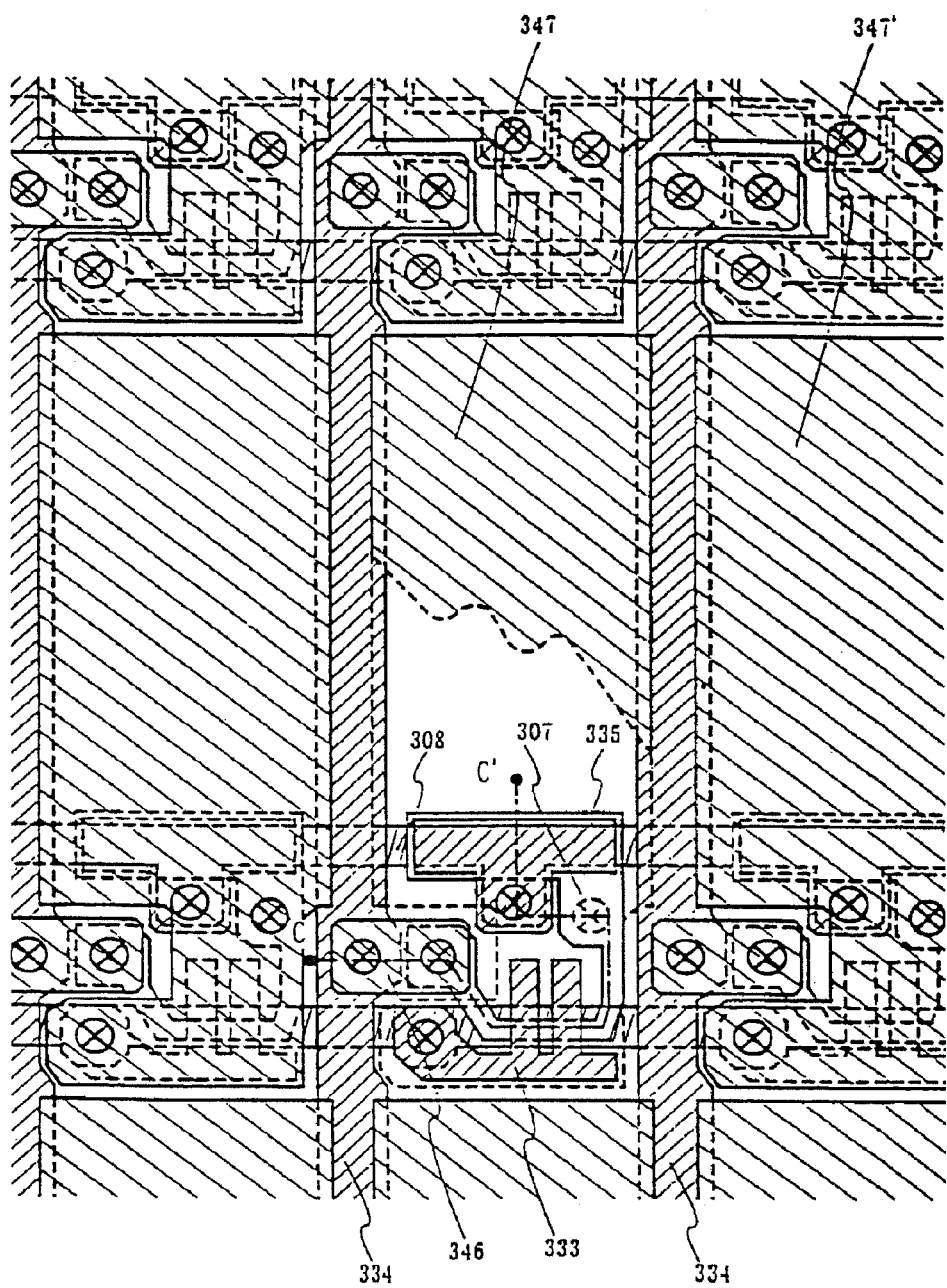
FIG. 8 is a plan view for explaining a pixel structure of the invention having the auxiliary capacity portion of an accumulating capacity type.
Figure 9:
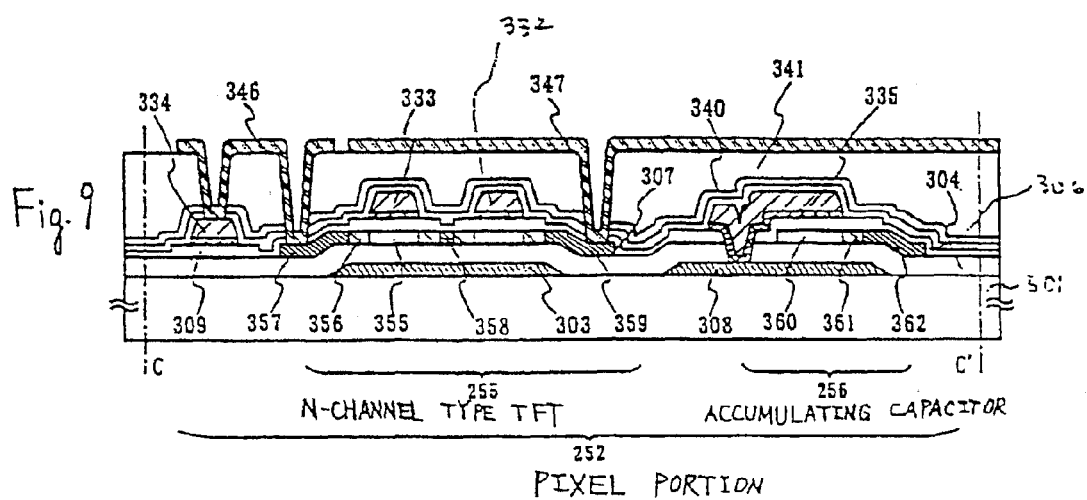
FIG. 9 is a cross-sectional view for explaining a pixel structure having a driving circuit portion and the auxiliary capacity portion of an accumulating capacity type.

The pixel structure of an accumulating capacity type adopts the same structure as the embodiment 1 except for a difference in the construction of an auxiliary capacity portion. FIG. 8 shows a plan view of this pixel structure of the accumulating capacity type. FIG. 9 shows a cross-sectional view corresponding to a C-C' line of FIG. 8. In this embodiment, an explanation will be made by using reference numerals common to FIGS. 8 and 9 for convenience.

A scanning line (gate line) 303 and a capacity line 308 are formed on a substrate 301 shown in FIG. 9. Semiconductor films 306, 307 are formed on a first insulating layer 304 so as to be partially overlapped with wirings of the scanning line and the capacity line. Further, a second insulating layer 309 functioning as a gate insulating film is formed, and gate electrodes 332 to 333, a data line 334 and a capacity electrode 335 are formed. In an n-channel type TFT 255, the gate electrode and the scanning line (gate line) are connected to each other through a contact hole formed in the first insulating layer, and a channel forming area formed by crossing the gate electrode and the semiconductor film is located on the scanning line (gate line) so that the scanning line (gate line) is utilized as a light interrupting film, which is similar to the embodiment 1.

An accumulating capacitor 256 is formed by a semiconductor film 306, a capacity electrode 335 and a second insulating layer formed between the semiconductor film 306 and the capacity electrode 335. The capacity electrode 335 is connected to a capacity line 308, and the semiconductor film 307 is connected to a pixel electrode 347. FIG. 8 shows a plan view of such a pixel portion 252. FIG. 10B shows an equivalent circuit of the pixel portion 252.

A pixel structure of the accumulating capacity type can be completed as mentioned above. Here, the display unit of a reflection type can be completed by forming the pixel electrode by a material such as aluminum and silver.

Embodiment 3

Figure 11:
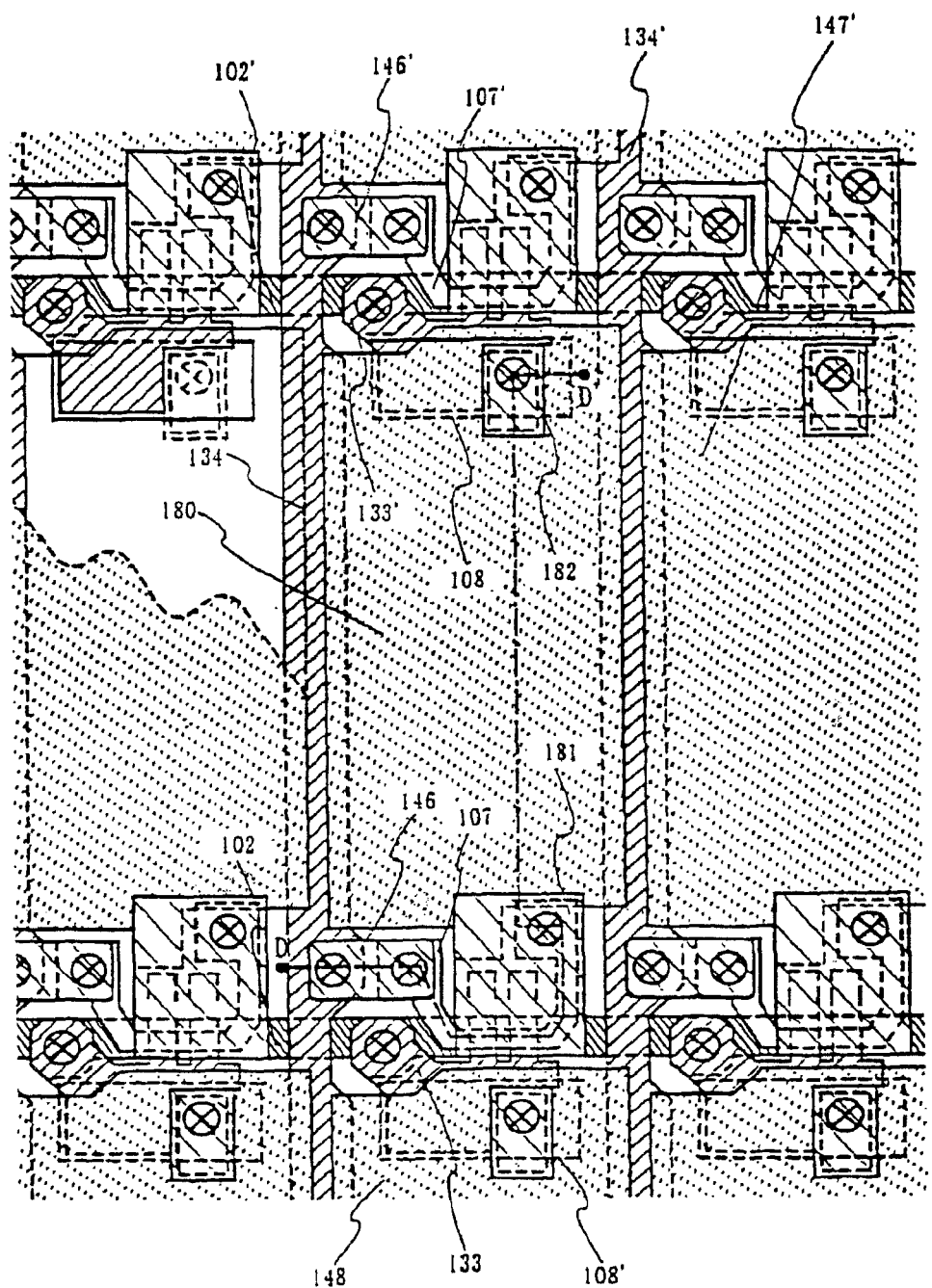
FIG. 11 is a plan view for explaining the pixel structure of a transmitting type display unit.

When the display unit of a transmission type is formed, the pixel electrode is formed by a transparent electroconductive film. FIG. 11 shows a pixel structure when the display unit of the transmission type is formed by using the invention. A pixel electrode 180 is formed by using a transparent electroconductive film such as ITO. Connection with a semiconductor film for forming a TFT and an auxiliary capacity portion is made by connecting electrodes 181 and 182. FIG. 12 shows a cross-sectional view corresponding to a D-D' line. An n-channel type TFT 205 and an auxiliary capacitor 206 are manufactured similarly to the embodiment 1. The pixel electrode 180 is formed after a contact hole is formed in an interlayer insulating film 142. Thereafter, the connecting electrodes 181, 182 are formed by using Ti and Al. The connecting electrode 181 is formed on a channel forming area of a semiconductor film forming the n-channel type TFT 205, and also functions as a light interrupting film similarly to the pixel structure shown in FIG. 1.

Embodiment 4

There is a method for forming the driving circuit and the pixel portion by only a p-channel type TFT or an n-channel type TFT as a means for realizing an active matrix type display unit by a small number of masks. It is necessary to make TFTs of the n-channel type and the p-channel type to form a CMOS circuit. Accordingly, it is surely necessary to use one mask for shielding p-type impurities or n-type impurities. A reduction in the number of processes is required to reduce manufacturing cost, and a reduction in mask number becomes an effective means.

In a method for forming a functional circuit by TFTs of a simple channel, there are an EEMOS circuit for forming the functional circuit by TFTs of an enhancement type, and an EDMOS circuit for forming the functional circuit by combining the enhancement type and a depression type.

FIG. 13A shows an example of the EEMOS circuit using the p-channel type TFT. FIG. 13B shows an example of the EDMOS circuit. In FIG. 13A, each of reference numerals 1301, 1302 designates a p-channel type TFT of the enhancement type (hereinafter called an E-type PTFT). In FIG. 13B, reference numerals 1303 and 1304 respectively designate an E-type PTFT and a p-channel type TFT of the depression type (hereinafter called a D-type PTFT).

In FIGS. 13A and 13B, $V_{DH}$ and $V_{DL}$ respectively designate a power line (positive power line) applying a positive voltage thereto, and a power line (negative power line) applying a negative voltage thereto. The negative power line may be also set to a power line (ground power line) having a ground electric potential.

FIG. 14 shows an example in which a shift register is formed by using the EEMOS circuit shown in FIG. 13A or the EDMOS circuit shown in FIG. 13B. In FIG. 14, reference numerals 1400, 1401 designate flip-flop circuits. A clock signal (CL) is inputted to a gate of the E-type PTFT 1402, and a clock signal (CL bar) having an inverted polarity is inputted to a gate of the E-type PTFT 1403. As shown in FIG. 14B, the EEMOS circuit shown in FIG. 13A or the EDMOS circuit shown in FIG. 13B is used in an inverter circuit 1404.

As mentioned above, a process for doping n-type impurities (donor) is reduced by setting all the TFTs to p-channel type TFTs so that the manufacturing process of the display unit can be simplified. Further, yield of the manufacturing process is improved and the effect of a reduction in manufacturing cost can be expected by this simplification.

The TFT of the pixel portion shown in the embodiment 1 or 2 is easily replaced with the p-channel type TFT. In case that the driving circuit is formed by applying the EEMOS circuit or the EDMOS circuit shown in this embodiment, the display unit of active matrix driving can be similarly manufactured.

Embodiment 5

One example of a process for manufacturing the EEMOS or the EDMOS shown in the embodiment 4 will be explained by using FIG. 15.

First, as shown in FIG. 15A, a scanning line (gate line) 1502 having an end portion of a taper shape is formed on a glass substrate 1501. A first insulating layer 1503 is formed by using a silicon nitride oxide film such that the first insulating layer 1503 has 200 nm in thickness.

Next, an amorphous semiconductor film 1503 is formed on the first insulating layer 1503 by the plasma CVD method such that the amorphous semiconductor film 1503 has 40 nm in thickness. A material such as silicon and silicon germanium is used as the amorphous semiconductor film 1503. The amorphous semiconductor film 1503 is crystallized by irradiating a laser beam to this amorphous semiconductor film 1503 so that a polycrystal semiconductor film is formed. A crystallization method is not limited to a laser anneal method, but other known crystallization methods may be used to form the polycrystal semiconductor film.

Next, as shown in FIG. 15B, the polycrystal semiconductor film is etched in a predetermined shape via an optical exposure process using a first photomask so that individually isolated semiconductor films 1506, 1505 are formed. The semiconductor films 1506, 1505 form a channel forming area of the TFT and a source or drain area at a completing time.

A process for doping an acceptor to the semiconductor film is performed in advance to form the D-type PTFT. First, a mask insulating film 1507 constructed by a silicon oxide film is formed. This mask insulating film 1507 is arranged to control the concentration of doped p-type impurities (acceptor) by using an ion doping method. The concentration of the implanted p-type impurities (acceptor) is set to range from $1\times10^{16}$ to $1\times10^{18}/cm^3$. This doping is performed with respect to the channel forming area of the D-type PTFT. In FIG. 15C, the doping is performed on an entire face of the semiconductor film 1506, and the semiconductor film 1505 forming the E-type PTFT is covered with a mask 1508 using a resist such that no acceptor is doped. Thus, a semiconductor film 1509 adding the p-type impurities (acceptor) thereto is formed. In a subsequent process, the D-type PTFT is formed by using this semiconductor film.

In FIG. 15D, a second insulating layer 1510 utilized as a gate insulating film is formed by the plasma CVD method such that this second insulating layer 1510 has 80 nm in thickness. The second insulating layer 1510 is formed by a silicon oxide film, a silicon nitride oxide film, etc. A first electroconductive film 1511 is formed by tantalum nitride or titanium nitride such that this first electroconductive film 1511 has a thickness from 20 to 40 nm, preferably a thickness of 30 nm. A second electroconductive film 1512 is formed on this first electroconductive film 1511. The second electroconductive film is formed by using Ta, W, Mo, Nb, Ti or nitrides of these metals such that this second electroconductive film has a thickness from 300 to 400 nm.

In a process shown in FIG. 15E, a resist mask 1513 is formed by an optical exposure process using a second photomask, and first electrodes 1514, 1515 are formed by etching the electroconductive films. In this process, an LDD area using a p-type impurity area and source and drain areas are formed in the semiconductor films in self alignment in combination with the doping process. In first etching process, an ICP (Inductively Coupled Plasma) etching method is used as a preferable technique of this first etching processing. $CF_4$ and $Cl_2$ are mixed in a gas for etching, and RF (13.56 MHz) power of 500 W is applied to an electrode of a coil type at a pressure from 0.5 to 2 Pa, preferably, a pressure of 1 Pa so that plasma is generated. RF (13.56 MHz) power of 100 W is also applied to a substrate side (sample stage), and a substantially negative self bias voltage is applied to the substrate side. When $CF_4$ and $Cl_2$ are mixed, the etching can be performed at speeds approximately equal to each other in the cases of a tungsten film, a tantalum nitride film and a titanium film.

In the above etching condition, an end portion can be formed in a taper shape by the shape of a mask using a resist and effects of the bias voltage applied to the substrate side. An angle of the taper portion is set to range from 15 to 45°. Further, an etching time is preferably increased in a ratio of about 10 to 20% to perform the etching without leaving any residue on the second insulating layer. A selecting ratio of the silicon nitride oxide film to the W-film ranges from 2 to 4 (typically 3). Accordingly, an exposed face of the silicon nitride oxide film is etched about 20 to 50 nm by overetching processing.

Further, second etching processing is performed. In this etching, the ICP etching method is used and $CF_4$ and $Cl_2$ are mixed in an etching gas, and RF power (13.56 MHz) of 500 W is supplied to an electrode of a coil type at a pressure of 1 Pa so that plasma is generated. RF (13.56 MHz) power of 50 W is applied to a substrate side (sample stage), and a self bias voltage lower than that in the first etching processing is applied to the substrate side. A tungsten film is anisotropically etched in such a condition such that a tantalum nitride film or a titanium film as a first electroconductive film is left. Thus, as shown in FIG. 15E, second electroconductive films 1514b, 1515b having widths narrower than those of first electroconductive layers 1514a, 1515a can be formed and are used as gate electrodes.

Next, second impurity areas 1516, 1519 are formed in semiconductor films 1505, 1509 by the ion doping method with the second electroconductive films 1514b, 1515b as masks. The doping is performed by applying an acceleration voltage to such an extent that p-type impurities pass through the first electroconductive films 1514a, 1515a and the gate insulating film 1510. Thus, the p-type impurities (acceptor) of $1\times10^{17}$ to $5\times10^{19}$/cm$^3$ are doped. In the ion doping method, $B_2H_6$ or $BF_3$, etc. are used as a source gas.

Further, first impurity areas 1517, 1520 are formed outside the second impurity areas by the ion doping method with the first electroconductive films 1514a, 1515a and the second electroconductive films 1514b, 1515b as masks. The second impurity area is set to a source or drain area, and the p-type impurities (acceptor) of $1\times10^{20}$ to $1\times10^{21}$/cm$^3$ are doped to the second impurity area.

In channel forming areas 1518, 1521, the p-type impurities (acceptor) are added to the channel forming area 1521 at a concentration lower than that of the second impurity area.

The p-type impurities (acceptor) in the p-type semiconductor area are next activated by taking a heat treatment. This activation is performed by furnace anneal, laser anneal, lamp anneal, or a combination of these anneals. In this embodiment, the heat treatment is taken for four hours at 500° C. within a nitrogen atmosphere. At this time, it is desirable to reduce oxygen within the nitrogen atmosphere as much as possible.

When the activation is terminated, a silicon oxide nitride film having 200 nm in thickness is formed as a passivation film 1522 as shown in FIG. 15F. Thereafter, hydrogenation processing is performed with respect to the semiconductor film. A publicly known hydrogen anneal technique or a plasma hydrogenation technique is used in the hydrogenation processing. Further, an interlayer insulating film 1523 having 800 nm in thickness and constructed by resin is formed. Polyimide, polyamide, acrylic resin, epoxy resin or BCB (benzocyclobutene) is used as this resin. Further, an inorganic insulating film may be also used.

Next, a contact hole is foamed in the interlayer insulating film 1523 by using a third photomask. Thereafter, wirings 1524 to 1527 are formed by using a fourth photomask. In this embodiment, a laminator of Ti and Al is formed as the wirings 1524 to 1527. A contact with the first impurity area is formed by Ti to improve heat resisting property.

Thus, an E-type PTFT 1551 and a D-type PTFT 1552 are completed. When only the E-type PTFT is formed, the E-type PTFT can be completed by using four photomasks. When the E-type PTFT and the D-type PTFT are formed on the same substrate, the E-type PTFT and the D-type PTFT can be completed by using five photomasks. A circuit shown in the embodiment 4 can be formed by using such TFTs.

Embodiment 6

Figure 16:
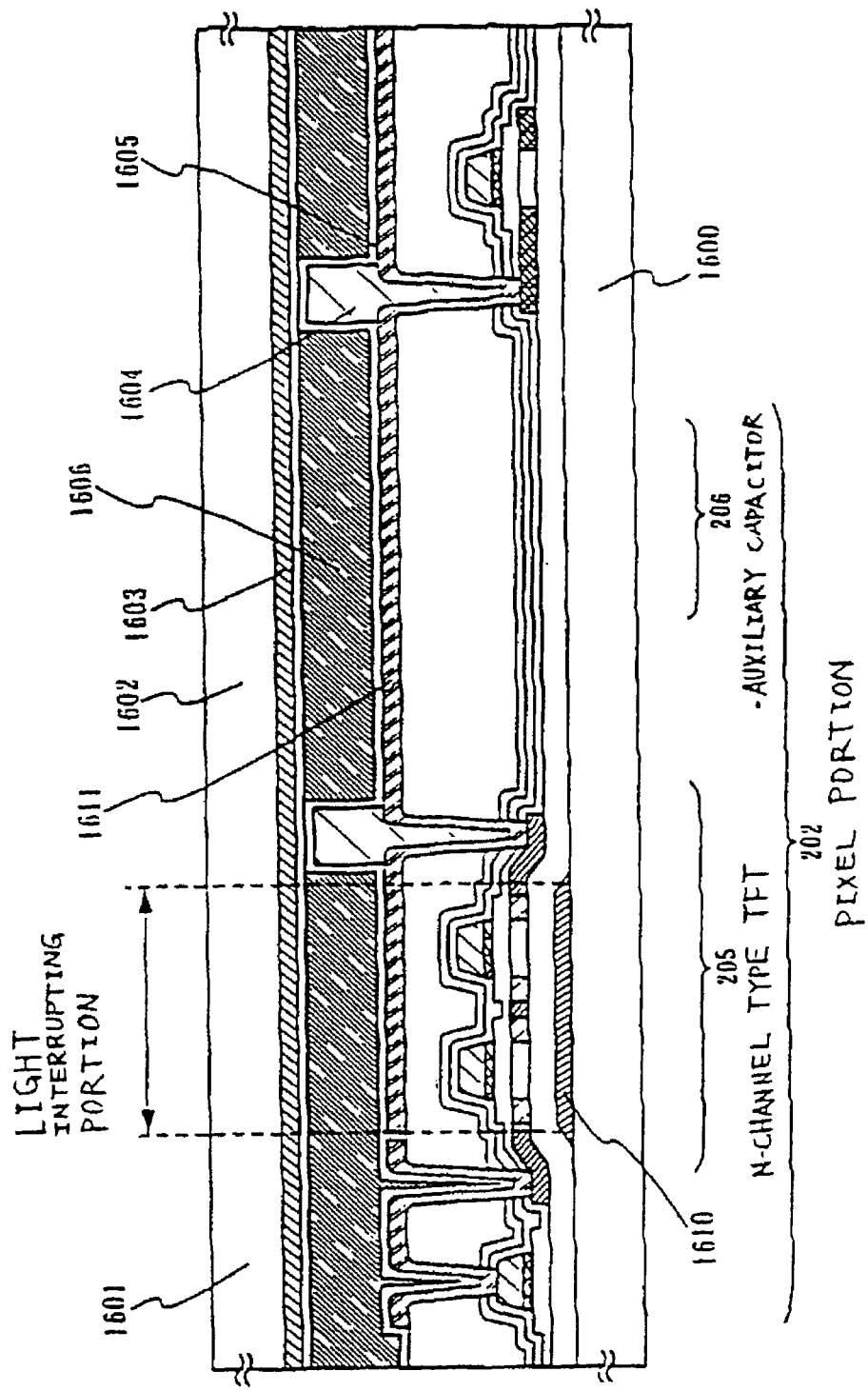
FIG. 16 is a cross-sectional view for explaining the structure of a liquid crystal display unit of a reflection type.

A process for manufacturing a liquid crystal display unit of active matrix driving from a substrate having the TFT formed and obtained by the method shown in each of the embodiments 1 to 5 will be explained in this embodiment. FIG. 16 shows a state in which an element substrate 1600 and an opposite substrate 1601 are stuck to each other by a sealant. A columnar spacer 1604 is formed on the element substrate 1600. The columnar spacer 1604 is preferably formed in conformity with the hollow of a contact portion formed on a pixel electrode. The columnar spacer 1604 is formed at a height from 3 to 10 μm although this height depends on a used liquid crystal material. Since a concave portion corresponding to a contact hole is formed in the contact portion, a disturbance of the orientation of a liquid crystal can be prevented by forming a spacer in conformity with this concave portion. Thereafter, an orientation film 1605 is formed and rubbing processing is performed. A transparent electroconductive film 1602 and an orientation film 1603 are formed in the opposite substrate 1601. Thereafter, the element substrate and the opposite substrate are stuck to each other and a liquid crystal is injected so that a liquid crystal layer 1606 is formed.

FIG. 16 shows the sectional structure of a pixel portion of the liquid crystal display unit of a reflection type. In this case, light is incident from a side of the opposite substrate 1601. When the liquid crystal display unit of a transmission type is formed, light is incident from a side of the element substrate 1600 by using a backlight. In any case, light is interrupted by a pixel electrode 1611 and a scanning line (gate line) 1610 in a channel forming area of an n-channel type TFT 205.

FIG. 17A shows a perspective view of the liquid crystal display unit. A pixel portion 1650, a scanning line side driving circuit 1651, a data line side driving circuit 1652, an external input terminal 1654, a connecting wiring 1653 from the external input terminal to an input portion of each circuit, etc. are formed on the element substrate 1600. An opposite electrode is formed in the opposite substrate 1601. Such an element substrate 1600 and the opposite substrate 1601 are stuck to each other through a sealant, and a liquid crystal is sealed onto inner sides of these substrates. Further, an FPC (Flexible Printed Circuit) is stuck to the external input terminal 1654 of the element substrate 1600. An IC chip assembling a CPU, a memory, an operational amplifier, etc. thereinto may be also mounted by COG.

FIG. 17B shows an enlarged view of the terminal portion 1654. A terminal is formed by a scanning line (gate line) or a data line, etc., and has a width from 100 to 1000 μm and a pitch of about 50 to 200 μm.

FIG. 18 is a cross-sectional view corresponding to an F-F' line shown in FIG. 17B and showing a detailed construction of this input terminal. A terminal 1801 is formed by a first electroconductive film. A first insulating layer 1802, a second insulating layer 1803 and a third insulating layer 1804 are formed on this terminal 1801. An opening portion removing these insulating films therefrom is formed on the terminal 1801, and an electrode 1805 preferably formed by a transparent electroconductive film material is formed. The opening portion and the electrode 1805 are integrally formed so that the terminal is formed. The terminal has a width from 100 to 1000 μm and a pitch of about 50 to 200 μm.

The liquid crystal display unit of the active matrix type manufactured as mentioned above can be used as display units of various kinds of electronic devices.

Embodiment 7

Figure 19:
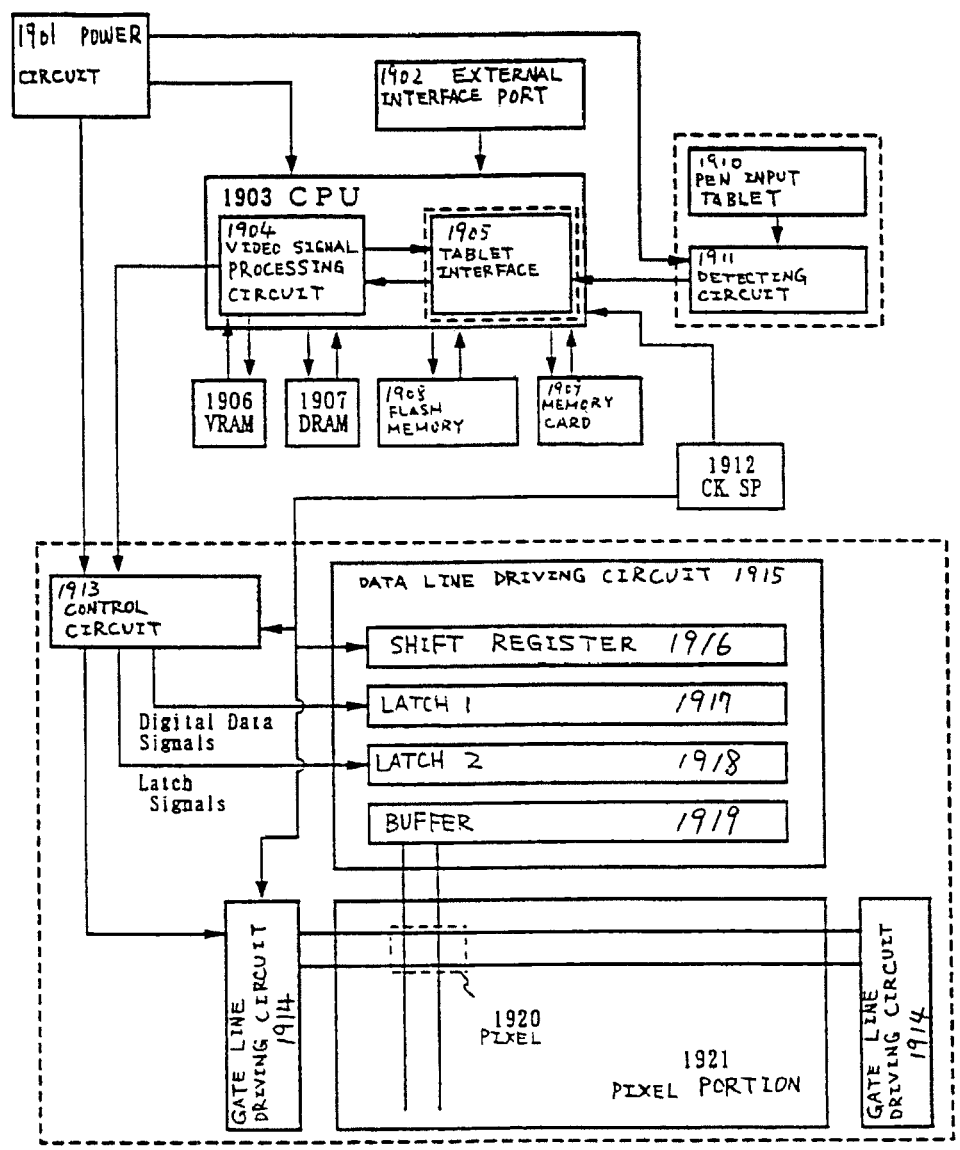
FIG. 19 is a block diagram for explaining the construction of an electronic device.
Figure 20:
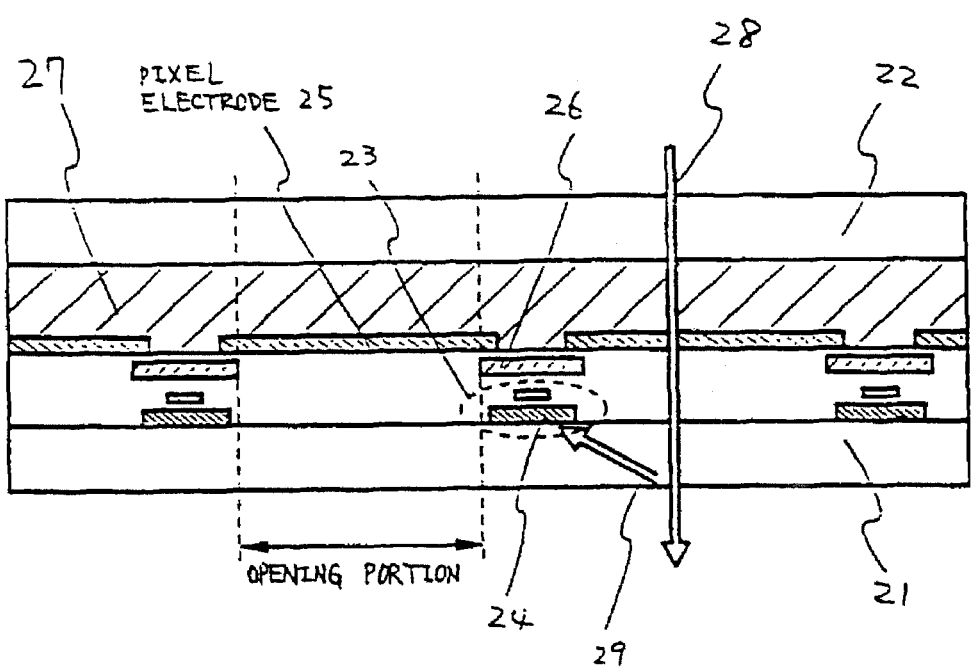
FIG. 20 is a view for explaining the structure of a pixel portion in which a light interrupting film is formed on a TFT.

One example of the semiconductor device using the display unit shown in each of the embodiments 1 to 6 will be explained by using FIG. 19. In FIG. 19, a pixel portion 1921 constructed by a pixel 1920 having a TFT, a data line driving circuit 1915 used to operate the pixel portion, and a scanning line (gate line) driving circuit 1914 are arranged in the display unit. The data line driving circuit 1915 shows an example of digital driving, and is constructed by a shift register 1916, latch circuits 1917, 1918 and a buffer circuit 1919. The scanning line (gate line) driving circuit 1914 has an unillustrated shift register, an unillustrated buffer, etc.

An external circuit connected to this display unit is constructed by a power circuit 1901 constructed by a stabilized power source and an operational amplifier with high speed high definition, an external interface port 1902 having a USB terminal, etc., a CPU 1903, a pen input tablet 1910 and a detecting circuit 1911 used as an input means, a clock signal oscillator 1912, a control circuit 1913, etc.

A video signal processing circuit 1904, a tablet interface 1905 for inputting a signal from the pen input tablet 1910, etc. are built in the CPU 1903. Further, a VRAM 1906, a DRAM 1907, a flash memory 1908 and a memory card 1909 are connected to the CPU 1903. Information processed by the CPU 1903 is outputted as a video signal (data signal) from the video signal processing circuit 1904 to the control circuit 1913. The control circuit 1913 has a function for converting a video signal and a clock to those for timings of the data line driving circuit 1915 and the scanning line (gate line) driving circuit 1914.

Concretely, the control circuit 1913 has a function for distributing the video signal to data corresponding to each pixel of the display unit, and a function for converting a horizontal synchronous signal and a vertical synchronous signal inputted from the exterior to a start signal of the driving circuit and a timing control signal of alternating current formation of a built-in power circuit.

It is desirable that a portable type information terminal such as PDA can be used for a long time even within the outdoors and the interior of a train with a battery of a charging type as a power source even when this information terminal is not connected to an AC plug socket. Further, such an electronic device lays emphasis on handy carrying and lightness in weight and compactness are simultaneously required. When the capacity of the battery occupying the greater part of weight of the electronic device is increased, this weight is increased. Accordingly, it is also necessary to take measures for controlling alighting time of a backlight and setting a standby mode in view of software so as to reduce power consumption of such an electronic device.

For example, when no input signal from the pen input tablet 1910 is inputted to the tablet interface 1905 for a constant time in the CPU 1903, the standby mode is set and the operation of a portion surrounded by a dotted line in FIG. 19 is synchronously stopped. Otherwise, a memory is arranged in each pixel, and it is switched to a display mode of a static image. Thus, the power consumption of the electronic device is reduced.

The power consumption can be also reduced by stopping functions of the video signal processing circuit 1904 and the VRAM 1906 of the CPU 1903 to display the static image. In FIG. 19, an operated portion is displayed by a dotted line. The controller 1913 may be mounted to the element substrate by a COG method using an IC chip, and may be also formed integrally with the interior of the display unit.

Embodiment 8

The semiconductor device of the present invention can be applied to the display device of various kind of semiconductor device. The following can be given as examples of this type of semiconductor devices: a portable information terminal (such as an electronic diary, a mobile computer, and a portable telephone), a video camera, a still camera, a personal computer, a television and a projector. Examples of these are shown in FIGS. 22 to 24.

FIG. 22A is a portable telephone, and is composed of a display panel 2701, an operation panel 2702, a connection portion 2703. A display panel 2701 is composed of a display device 2704, a sound output portion 2705 and an antenna 2709. An operation panel 2702 is composed of an operation key 2706, a power source switch 2702 and a sound input portion 2705. The present invention can form a display device 2704.

FIG. 22B is a video camera, and is composed of a main body 9101, a display device 9102, an audio input portion 9103, operation switches 9104, a battery 9105, and an image receiving portion 9106. The present invention can be applied to the display device 9102.

FIG. 22C is a mobile computer, or a portable type information terminal, and is composed of a main body 9201, a camera portion 9202, an image receiving portion 9203, operation switches 9204, and a display device 9205. The present invention can be applied to the display device 9205.

FIG. 22D is a television, and is composed of components such as a main body 9401, speakers 9402, a display portion 9403, which is typified by the liquid crystal display device or the EL display device, a signal receiving device 9404, and an amplifying device 9405. The present invention can be applied to the display portion 9403.

FIG. 22E is a portable book, and is composed of a main body 9501, a display device 9503, a recording medium 9504, operation switches 9505, and an antenna 9506, and is used for displaying data recorded on a mini-disk (MD) or a DVD (digital versatile disc), and for displaying data received by the antenna. The present invention can be applied to the display device 9503.

Figure 23A:
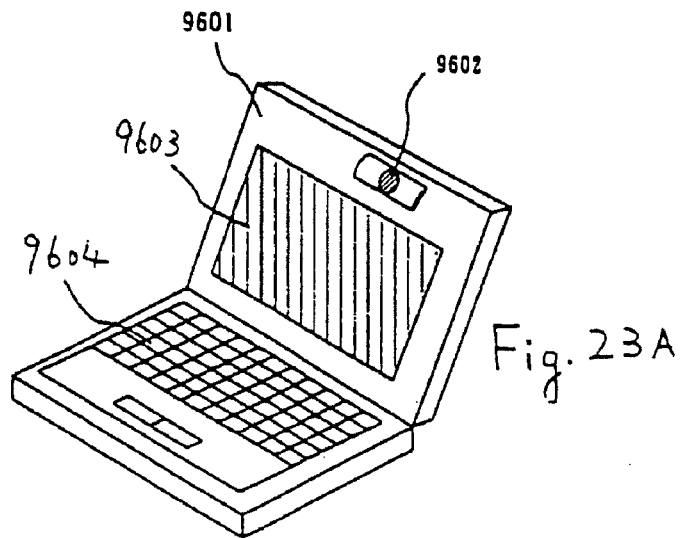
FIGS. 23A to 23C are views showing examples of the semiconductor devices.

FIG. 23A is a personal computer, and is composed of a main body 9601, an image input portion 9602, a display portion 9603, which is typified by the liquid crystal display device or the EL display device, and a keyboard 9604. The present invention can be applied to the display portion 9601.

Figure 23B:
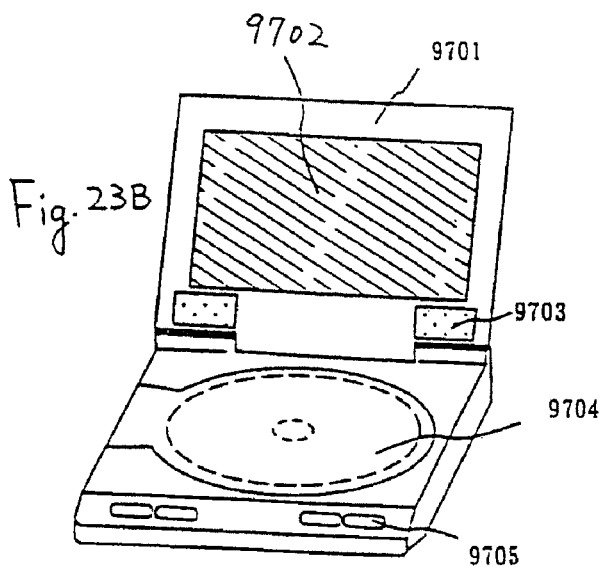

FIG. 23B is a player using a recording medium on which a program is recorded (hereafter referred to as a recording medium), and is composed of a main body 9701, a display device 9702, which is typified by the liquid crystal display device or the EL display device, a speaker portion 9703, a recording medium 9704, and operation switches 9705. Note that media such as a DVD (Digital Versatile Disk) and a CD can be used as the recording medium for this device, and that the player can be used for music appreciation, film appreciation, games, and Internet. The present invention can be applied to the display device 9702.

Figure 23C:
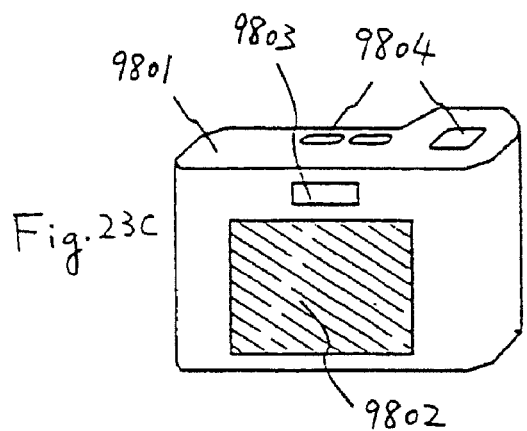

FIG. 23C is a digital camera, and is composed of a main body 9801, a display device 9802, which is typified by the liquid crystal display device or the EL display device, an eyepiece portion 9803, operation switches 9804, and an image receiving portion (not shown in the figure). The present invention can be applied to the display device 9802.

FIG. 24A is a front type projector, and is composed of a projecting apparatus 3601 and a screen 3602. The present invention can be applied to the projecting apparatus 3601.

FIG. 24B is a rear type projector, and is composed of a main body 3701, a projecting apparatus 3702, a mirror 3703, and a screen 3704. The present invention can be applied to the liquid crystal display device installed in the projecting apparatus 3702.

Note that an example of the structure of the projecting apparatuses 3601 and 3702 of FIG. 24A and FIG. 24B is shown in FIG. 24C. The projecting apparatuses 3601 and 3702 are composed of a light source optical system 3801, mirrors 3802 and 3804 to 3806, a dichroic mirror 3803, a prism 3807, a liquid crystal display portion 3808, a phase difference plate 3809, and a projecting optical system 3810. The projecting optical system 3810 is an optical system including a plurality of projecting lenses. A three-plate type example is shown in Embodiment 8, but there are no particular limitations, and a single plate type may also be used, for example. Further, optical systems such as an optical lens, a film having a light polarizing function, a film for regulating the phase, and an IR film may be suitably placed in the optical path shown by the arrow in FIG. 24C by the operator.

Furthermore, FIG. 24D is a diagram showing one example of the light source optical system 3801 in FIG. 24C. In Embodiment 8, the light source optical system 3801 is composed of a reflector 3811, a light source 3812, lens arrays 3813 and 3814, a polarizing transformation element 3815, and a condenser lens 3816. Note that the light source optical system shown in FIG. 24D is one example, and the light source optical system is not particularly limited to the structure shown in the figure. For example, optical systems such as an optical lens, a film having a light polarizing function, a film for regulating the phase, and an IR film may be suitably added by the operator to the light source optical system.

Though not shown in the figure, the present invention can be implemented when manufacturing a navigation system, a refrigerator, an electronic washing machine, a micro waved oven, telephone etc. using the image display device. The applicable scope of the present invention of this specification is thus extremely wide, and the present invention can be implemented various electronic devices.

As explained above, elements such as a scanning line, a data line, a TFT and an auxiliary capacitor required for the construction of a pixel can be efficiently arranged at a limited pixel size by using the invention. Accordingly, a numerical aperture from 70 to 80% can be realized in the display unit of the reflection type. Further, the invention can realize a pixel structure (further including the TFT of a driving circuit) having such a high numerical aperture by using six photomasks.

What is claimed is:

1. A manufacturing method of a semiconductor device, comprising the steps of:
    forming a first conductive layer over a substrate;
    forming a scan line in a pixel portion and a first wiring in a driving circuit by patterning the first conductive layer;
    forming a first insulating layer over the scan line and the first wiring;
    forming a semiconductor layer over the first insulating layer;
    etching the semiconductor layer to form a region;
    forming a second insulating layer over the semiconductor layer and the first insulating layer, the second insulating layer having an opening;
    forming a second conductive layer over the second insulating layer;
    forming a data line in the pixel portion and a second wiring in the driving circuit by patterning the second conductive layer; and
    forming a third insulating layer over the data line and the second wiring,
    wherein the second wiring is electrically connected to the first wiring through the opening,
    wherein a transistor in the driving circuit comprises the first wiring, the region including a channel formation region, and the second wiring, and
    wherein the first wiring, the second wiring, and the channel formation region are overlapped with each other.

2. The manufacturing method of a semiconductor device according to claim 1, wherein a thickness of the second insulating layer is thinner than that of the first insulating layer.

3. The manufacturing method of a semiconductor device according to claim 1, further comprising the step of forming a third wiring after forming the third insulating layer,
    wherein the third wiring is electrically connected to the semiconductor layer.

4. The manufacturing method of a semiconductor device according to claim 1, wherein the second wiring serves as a gate of the transistor in the driving circuit.

5. The manufacturing method of a semiconductor device according to claim 1,
    wherein the region further includes a first lightly doped drain region and a second lightly doped drain region, and
    wherein the channel formation region is interposed between the first lightly doped drain region and the second lightly doped drain region.

6. The manufacturing method of a semiconductor device according to claim 1, wherein the semiconductor layer includes poly-crystalline silicon.

7. The manufacturing method of a semiconductor device according to claim 1, further comprising the step of forming a light interrupting film in the pixel portion at the same time as forming the first wiring,
    wherein the pixel portion comprises a transistor over the light interrupting film.

8. A manufacturing method of a semiconductor device, comprising the steps of:

forming a first conductive layer over a substrate;
forming a scan line in a pixel portion and a first wiring in a driving circuit by patterning the first conductive layer;
forming a first insulating layer over the scan line and the first wiring;
forming a semiconductor layer over the first insulating layer;
etching the semiconductor layer to form a region;
forming a second insulating layer over the semiconductor layer and the first insulating layer, the second insulating layer having an opening;
forming a second conductive layer over the second insulating layer;
forming a data line in the pixel portion and a second wiring in the driving circuit by patterning the second conductive layer; and
forming a third insulating layer over the data line and the second wiring, wherein the second wiring is electrically connected to the first wiring through the opening,
wherein a transistor in the driving circuit comprises the first wiring, the region including a channel formation region, and the second wiring,
wherein the first wiring, the second wiring, and the channel formation region are overlapped with each other, and
wherein, in a channel length direction of the channel formation region, a width of the first wiring is larger than that of the second wiring.

9. The manufacturing method of a semiconductor device according to claim 8, wherein a thickness of the second insulating layer is thinner than that of the first insulating layer.

10. The manufacturing method of a semiconductor device according to claim 8, wherein the second wiring serves as a gate of the transistor in the driving circuit.

11. The manufacturing method of a semiconductor device according to claim 8, further comprising the step of forming a third wiring after forming the third insulating layer,
wherein the third wiring is electrically connected to the semiconductor layer.

12. The manufacturing method of a semiconductor device according to claim 8,
wherein the region further includes a first lightly doped drain region and a second lightly doped drain region, and
wherein the channel formation region is interposed between the first lightly doped drain region and the second lightly doped drain region.

13. The manufacturing method of a semiconductor device according to claim 8, wherein the semiconductor layer includes poly-crystalline silicon.

14. The manufacturing method of a semiconductor device according to claim 8, further comprising the step of forming a light interrupting film in the pixel portion,
wherein the pixel portion comprises a transistor over the light interrupting film.

* * * * *

UNITED STATES PATENT AND TRADEMARK OFFICE
CERTIFICATE OF CORRECTION

PATENT NO. : 8,551,796 B2
APPLICATION NO. : 13/280439
DATED : October 8, 2013
INVENTOR(S) : Shunpei Yamazaki Page 1 of 1

It is certified that error appears in the above-identified patent and that said Letters Patent is hereby corrected as shown below:

In the Specification

Column 4, line 51, after "construction" insert --of--;

Column 9, line 66, replace "town" with --to an--;

Column 14, line 20, replace "foamed" with --formed--;

Column 16, line 13, replace "alighting" with --a lighting--.

Signed and Sealed this
Eighteenth Day of March, 2014

Michelle K. Lee
*Deputy Director of the United States Patent and Trademark Office*